United States Patent
Hioka et al.

(10) Patent No.: US 8,957,501 B2
(45) Date of Patent: Feb. 17, 2015

(54) NON-VOLATILE SEMICONDUCTOR STORAGE DEVICE

(71) Applicants: Takeshi Hioka, Kanagawa (JP); Yoshiaki Fukuzumi, Kanagawa (JP)

(72) Inventors: Takeshi Hioka, Kanagawa (JP); Yoshiaki Fukuzumi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/671,077

(22) Filed: Nov. 7, 2012

(65) Prior Publication Data
US 2013/0113080 A1 May 9, 2013

(30) Foreign Application Priority Data
Nov. 8, 2011 (JP) .................................. 2011-244097

(51) Int. Cl.
  *H01L 27/06* (2006.01)
  *H01L 27/115* (2006.01)
  *H01L 49/02* (2006.01)

(52) U.S. Cl.
  CPC ...... *H01L 27/11582* (2013.01); *H01L 27/1157* (2013.01); *H01L 27/11573* (2013.01); *H01L 28/88* (2013.01)
  USPC .................................. 257/532; 257/E27.025

(58) Field of Classification Search
  USPC ........................................... 257/532, E27.025
  See application file for complete search history.

(56) References Cited

U.S. PATENT DOCUMENTS

| 4,827,323 | A  | * | 5/1989 | Tigelaar et al. ............... 257/534 |
| 5,206,787 | A  | * | 4/1993 | Fujioka ......................... 257/307 |
| 6,576,946 | B1 |   | 6/2003 | Kanai et al. |
| 2002/0106854 | A1 | * | 8/2002 | Takeuchi et al. .............. 438/239 |
| 2003/0109100 | A1 | * | 6/2003 | Takata et al. .................. 438/239 |
| 2004/0166627 | A1 | * | 8/2004 | Lim et al. ...................... 438/241 |
| 2004/0179398 | A1 | * | 9/2004 | Kleveland et al. ........ 365/185.03 |
| 2009/0219669 | A1 |   | 9/2009 | Lai |
| 2010/0090188 | A1 |   | 4/2010 | Futatsuyama |
| 2010/0127351 | A1 | * | 5/2010 | Quinn ........................... 257/534 |
| 2010/0148304 | A1 | * | 6/2010 | Rahim et al. .................. 257/532 |
| 2011/0175159 | A1 | * | 7/2011 | Itagaki et al. ................. 257/326 |
| 2012/0236642 | A1 | * | 9/2012 | Lue ........................... 365/185.05 |
| 2013/0051116 | A1 | * | 2/2013 | En et al. ........................ 365/148 |
| 2013/0075802 | A1 | * | 3/2013 | Chen et al. .................... 257/314 |

FOREIGN PATENT DOCUMENTS

| JP | 2001-156263 | 6/2001 |
| JP | 2006-253709 | 9/2006 |
| JP | 2009-224565 | 10/2009 |
| JP | 2010-080729 | 4/2010 |
| JP | 2010-129740 | 6/2010 |
| JP | 2010-080729 | * 8/2010 |

* cited by examiner

*Primary Examiner* — Victor A Mandala
(74) *Attorney, Agent, or Firm* — Patterson & Sheridan, LLP

(57) ABSTRACT

A non-volatile semiconductor storage device contains a memory cell region, a first electrode, and a second electrode. The memory cell region is formed on a substrate and comprises multiple memory cells stacked on the substrate as part of memory strings. Multiple first conductive layers are laminated on the substrate. The first electrode functions as an electrode at one side of a capacitive component and comprises multiple conductive layers stacked on the substrate and separated horizontally from stacked conductive layers of the second electrode which is disposed at a side of the capacitive component opposite the first electrode.

14 Claims, 21 Drawing Sheets

15 CAPACITOR REGION

NON-VOLATILE SEMICONDUCTOR STORAGE DEVICE

CROSS-REFERENCE TO RELATED APPLICATION

This application is based upon and claims the benefit of priority from Japanese Patent Application No. 2011-244097, filed Nov. 8, 2011; the entire contents of which are incorporated herein by reference.

FIELD

Embodiments described herein relates to non-volatile semiconductor storage device.

BACKGROUND

In recent years, to increase semiconductor integration, many proposed configurations of semiconductor storage devices have memory cells that are arranged three-dimensionally. In this kind of three-dimensionally structured semiconductor storage device, a capacitive component is needed, much like the case of conventional plane-structured semiconductor storage devices. The capacitive component is used for boosting the power supply voltage or as a supplementary component. Similar to a memory cell, reduction of the occupied area by a capacitive component is recognized to be beneficial.

DETAILED DESCRIPTION

According to a first embodiment of the present disclosure, there is provided a non-volatile semiconductor storage device which has a design that minimizes the circuit area occupied by a capacitive component of the non-volatile semiconductor storage device.

The non-volatile semiconductor storage device of this embodiment includes a memory cell region, a first electrode, and a second electrode. The memory cell region is formed on a substrate and contains a plurality of stacked memory cells. A plurality of conductive layers are stacked on the substrate to form the first electrode, which functions as an electrode on one side of the capacitive component. A plurality of conductive layers are stacked on a substrate to form the second electrode. The conductive layers of the second electrode are separated horizontally from the first electrode so that the second electrode functions as an electrode on the other side of the capacitive component, opposite the first electrode.

First Embodiment

Figure 1:
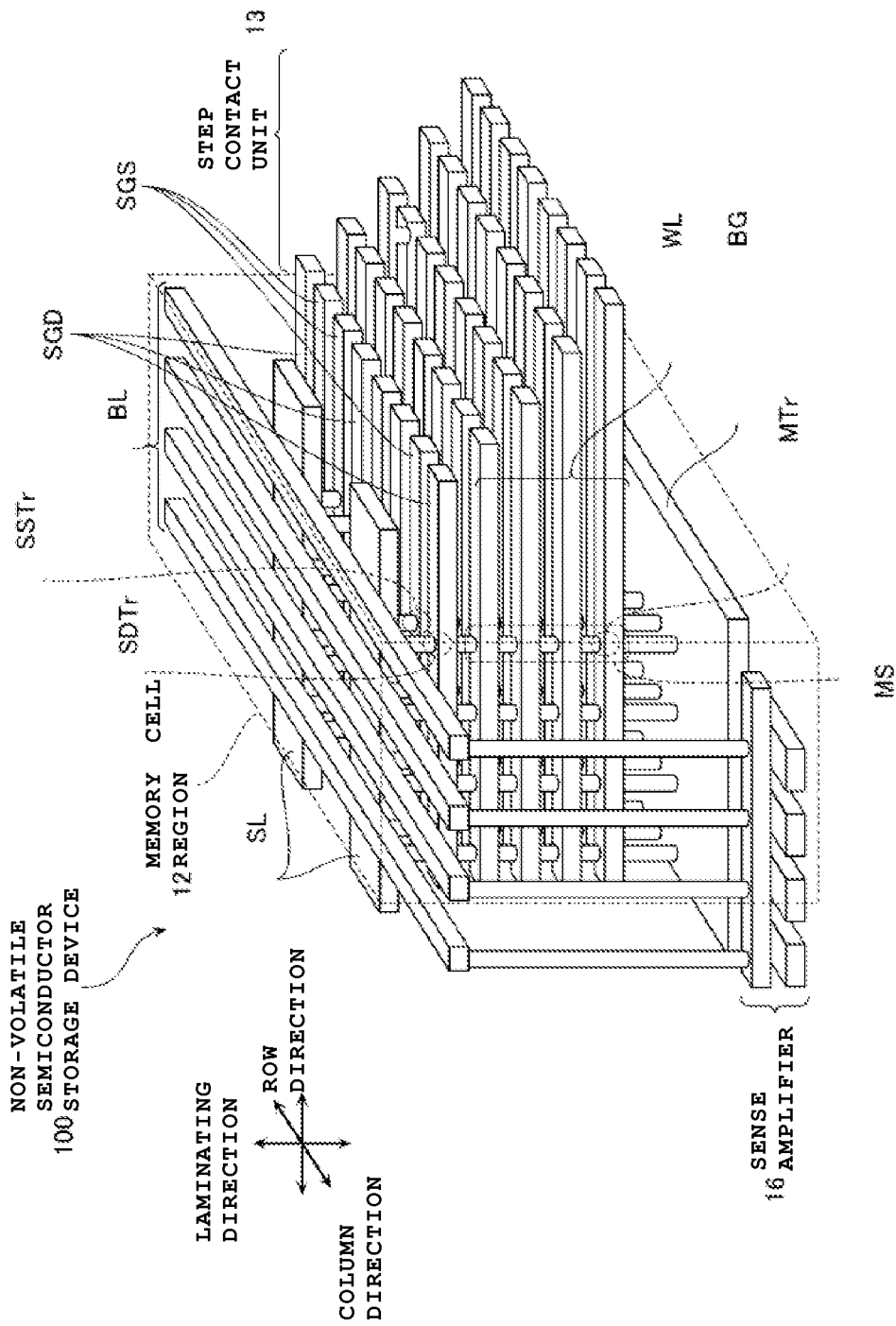
FIG. 1 is a schematic diagram of a non-volatile semiconductor storage device according to a first embodiment.

FIG. 1 shows a schematic drawing depicting the structure of a non-volatile semiconductor storage device 100 of the first embodiment. As shown in FIG. 1, the non-volatile semiconductor storage device 100 of the first embodiment includes a memory cell region 12 and a step contact unit 13. In addition, although not shown in FIG. 1, the non-volatile semiconductor storage device 100 includes a surrounding circuit region 14, a capacitor region 15 and a sense amplifier 16.

A memory cell region 12 contains a plurality of memory cells MTr that can store data. Each memory cell MTr is a non-volatile memory cell that can store electric charge in a charge storing film. The non-volatile memory cells can store data based on the magnitude of the stored charge. Memory cells MTr are serially connected to form a memory string MS. A plurality of memory strings MS are arranged in a matrix in the memory cell region 12. Each memory string MS of this embodiment is arranged so as to have a U-shaped cross-section. That is, each memory string MS is comprised of two vertical (extending in the laminating direction) components which are connected by a horizontal (in the row-column plane) connector located at the bottom end of the vertical components. All of the memory strings MS have substantially the same configuration.

Each memory string MS has a drain-side selecting transistor SDTr on one of its ends. The drain-side selecting transistor SDTR connects the memory string MS to a bit line BL at the drain side of the memory string MS. There are a plurality of bit lines BL, and groups of bit lines BL may be arranged within a memory block. The sense amplifier 16 amplifies the electric potential read out from the memory cell MTr to the bit line BL.

Additionally, each memory string MS has a source-side selecting transistor SSTr connected to its other end (the end not connected to drain-side selecting transistor SDTR) and is connected to a source line SL through this source-side selecting transistor SSTr. Memory cells MTr within a memory string MS are connected to the corresponding memory cells MTr in different memory strings MS with word lines WL, such that, for example, the first memory cell MTr in a memory string (MTr1) is connected via a word line (WL1) to first memory cell MTr in other memory strings MS.

Figure 2:
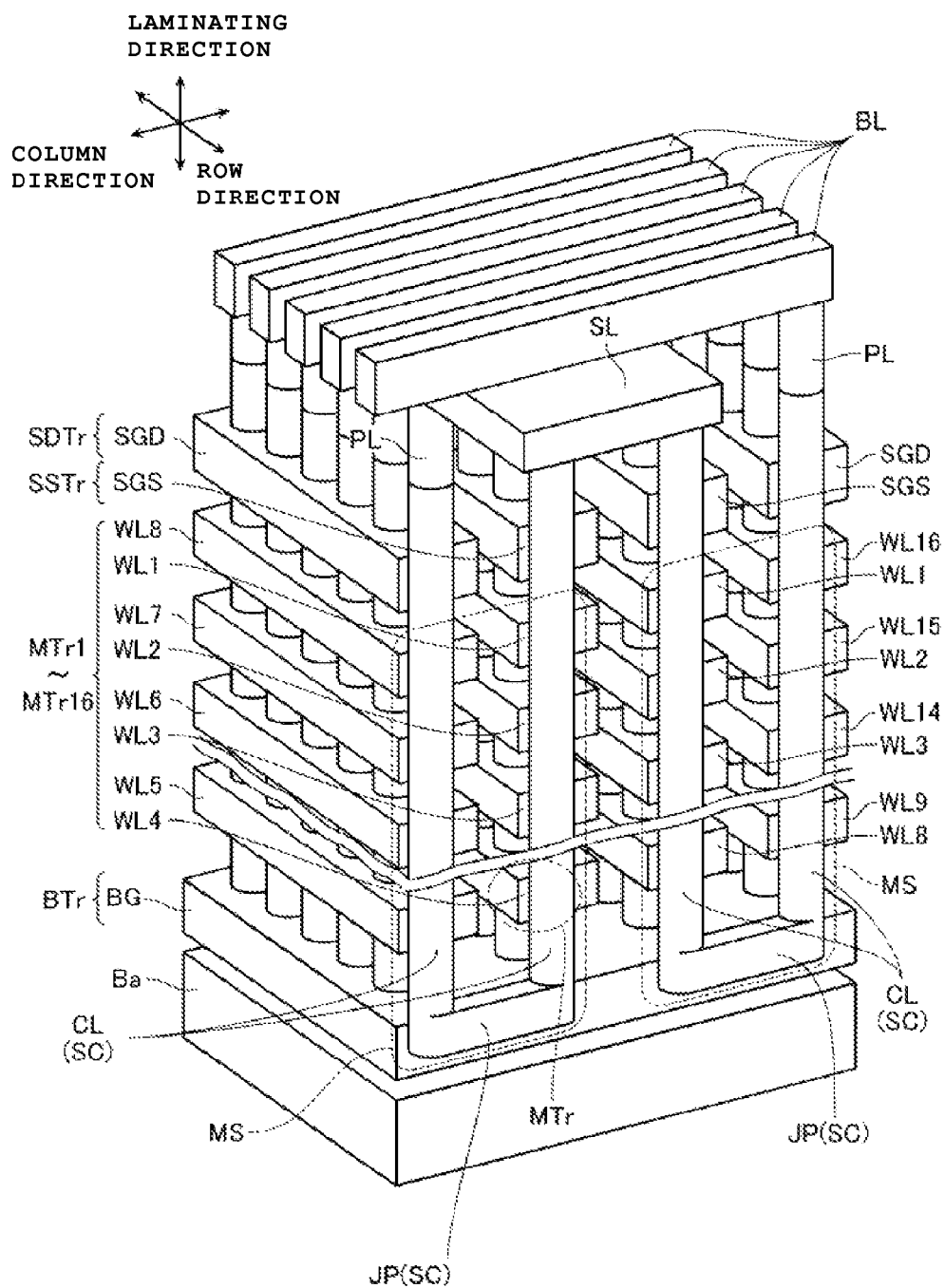
FIG. 2 is a schematic perspective view of a portion of a memory cell region in the non-volatile semiconductor storage device of the first embodiment.
Figure 3:
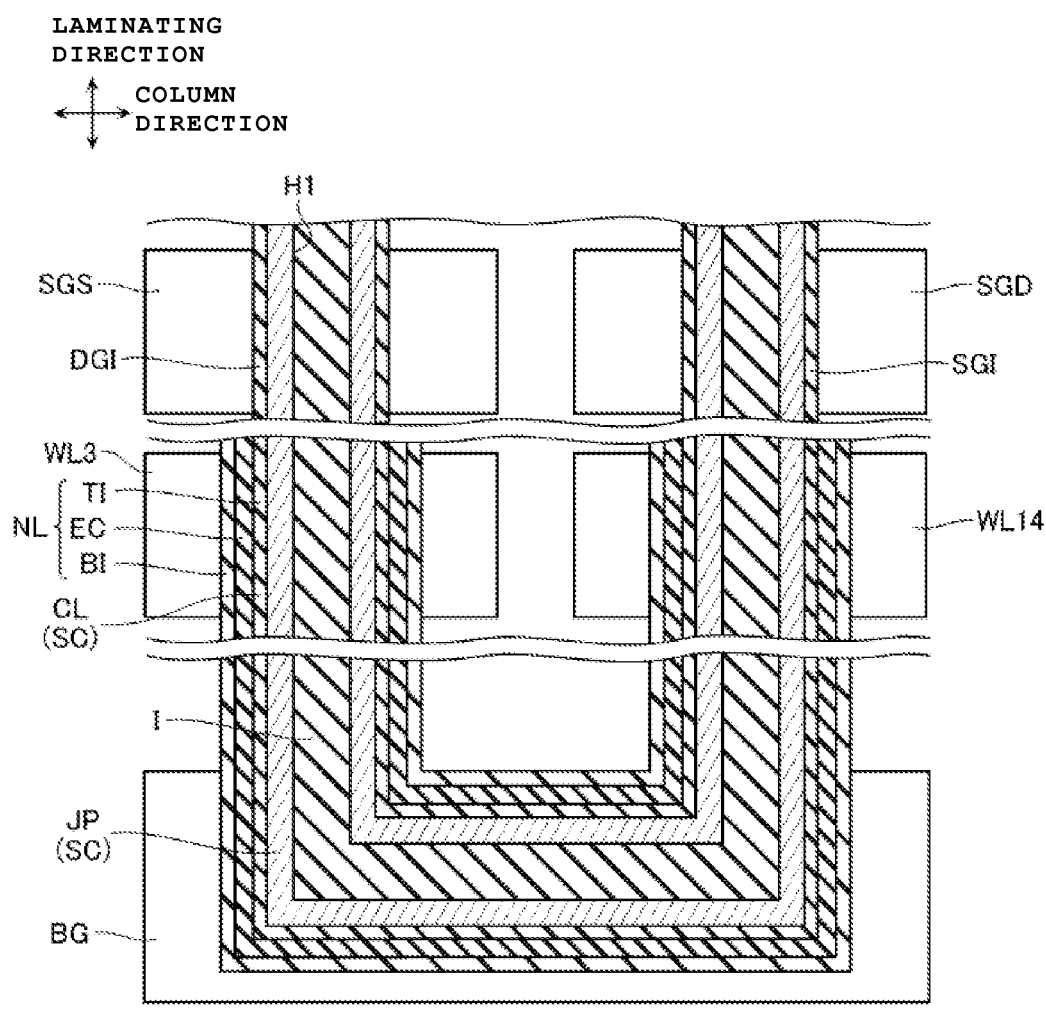
FIG. 3 is a partially enlarged cross-sectional view of FIG. 2.

FIG. 2 is a perspective view of a portion of the memory cell region 12 in the non-volatile semiconductor storage device 100 of the first embodiment. FIG. 3 is a partially enlarged cross-sectional view of FIG. 2. In the first example embodiment, the memory cell region 12 contains the memory strings MS, each of which is composed of memory cells MTr1 to Mtr16.

The plurality of memory strings MS are arranged in a matrix in the memory cell region 12. Each memory string MS has a structure in which a plurality of memory cells MTr are serially connected. Each memory cell MTr is electrically rewriteable.

Each memory string MS includes a U-shaped semiconductor SC, a word line WL (WL1 to WL16), and aback gate line BG. Each U-shaped semiconductor SC is formed in a U-shape, when viewed from the row direction. The U-shaped semiconductor SC contains a pair of columns CL which each extend perpendicular to a semiconductor substrate Ba, and which come together at a junction point JP at the bottom end of the pair of column CL. As shown in FIG. 3, each U-shaped semiconductor SC also has a region H1 that is continuous from one upper end of the column CL to the upper end of the other column CL through junction point JP. An insulating unit I is formed within region H1. The columns CL may be either cylindrical or prismatic. The columns CL may have a single width or may vary in width throughout their height. The row direction here may be taken as the direction parallel to the semiconductor substrate, while the column direction is also in a direction parallel with the semiconductor substrate, but at a right angle to the row direction. The U-shaped semiconductor SC is arranged so that a line that connects the central axis of a pair of columns CL is parallel to the column direction.

Each word line WL in each layer extends lengthwise in the row direction. The word lines WL in each layer are formed so that they are separated by insulating regions of a designated interval. The word lines WL of each layer (e.g., WL1 to WL16) are spaced from one another in the column direction. The memory cells MTr1 to MTr16 are each connected to a corresponding word lines WL1 to 16.

As shown in FIG. 3, between the word line WL and the column CL, an ONO (Oxide-Nitride-Oxide) layer NL is formed. The ONO layer NL contains a tunnel insulating layer TI which is in contact with the column CL, an electrical charge storing layer EC which is in contact with a tunnel insulating layer TI, and a block insulating layer BI which is in contact with the electrical charge storing layer EC. The electrical charge storing layer EC surrounds the lateral surface of the column CL. That is, the electrical charge storing layer EC encases the outer perimeter of column CL over at least some portion of column CL's length. Each word line WL also surrounds the lateral surface of the column CL and the electrical charge storing layer EC for some portion of the column CL's length.

Drain-side selecting gate line SGD is located above the uppermost layer containing a word line WL. The drain-side selecting gate line SGD extends lengthwise in the row direction. The drain-side selecting gate lines SGD are formed so that they are separated by insulating regions of a designated interval. The drain-side selecting lines SGD are spaced from one another in the column direction. A source-side selecting gate line SGS, which extends lengthwise in the row direction, is located between adjacent drain-side selecting gate lines SGD. Each U-shaped semiconductor SC is formed so that one of its columns CL penetrates a drain-side selecting gate line SGD. As shown in FIG. 3, a gate insulating layer DGI is formed between the drain-side selecting gate line SGD and the penetrating column CL.

A source-side selecting gate line SGS is located above the uppermost layer containing a word line WL. Both the drain-side selecting gate lines SGD and the source-side selecting gate line SGS are located on the same level.

The source-side selecting gate line SGS extends lengthwise in the row direction. The source-side selecting gate lines SGS are formed so that they are separated by insulating regions of a designated interval. The source-side selecting lines SGS are spaced from one another in the column direction. A drain-side selecting gate line SGD is located between adjacent source-side selecting gate lines SGS. Each U-shaped semiconductor SC is formed so that one of its columns CL penetrates a source-side selecting gate line SGS. As shown in FIG. 3, a gate insulating layer SGI is formed between the source-side selecting gate line SGS and the column CL.

As seen in FIG. 2, there is a repeating pattern in the memory region 12 comprising two drain-side selecting gate lines SGD followed by two source-side selecting gate lines SGS positioned one after the other in the column direction. Additionally, each drain-side selecting gate line SGD and each source-side selecting gate line SGS is formed surrounding a column CL, a gate insulating layer SGI, and a DGI.

A planar back gate line BG expands in the row-column plane to cover the bottom surface of a plurality of junction points JP. As shown in FIG. 3, ONO layer NL is formed between back gate line BG and junction point JP.

Source lines SL extend lengthwise in the row direction and are formed to contact the upper ends of columns CL which are adjacent in the column direction on separate U-shaped semiconductors SC.

Bit lines BL are connected through a plug line PL that extends past the drain-side selecting gate line SGD to the upper ends of columns CL not connected to source lines SL. Each bit line BL is positioned above the source lines SL. Each bit line BL is located in the row direction with a designated interval between adjacent bit lines BL. Each bit line extends lengthwise in the column direction.

Figure 4:
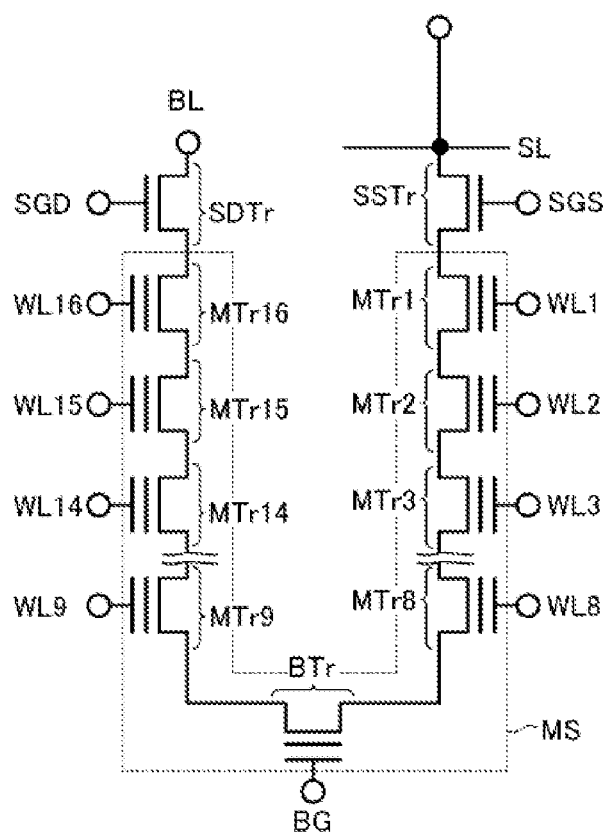
FIG. 4 is a circuit diagram of a memory string in the first embodiment.

Next, FIG. 2 to FIG. 4 depict the circuit structure of a memory string MS of the first embodiment. FIG. 4 is the circuit diagram of one of the memory string MS of the first embodiment.

As shown in FIG. 2 to FIG. 4, each memory string MS of the first embodiment contains sixteen memory cells MTr1 to MTr16, and a single back a gate transistor BTr. The source-side selecting transistor SSTr is connected to one end of the memory string MS on the source side and the drain-side selecting transistor SDTr is connected to the other end of the memory string MS on the drain side (refer to FIG. 4).

Each memory cell MTr is composed of a column CL, the ONO layer NL (electrical charge storing layer EC), and a word line WL. The word line WL that is in contact with the ONO layer NL functions as the gate of the memory cell MTr.

The drain-side selecting transistors SDTr are composed of a column CL, a gate insulating layer DGI, and a drain-side selecting gate line SGD. The drain-side selecting gate line SGD that is in contact with the gate insulating layer DGI functions as a gate of drain-side selecting transistor SDTr.

The source-side selecting transistors SSTr are composed of the column CL, a gate insulating layer SGI, and a source-side selecting gate line SGS. The source-side selecting gate line SGS that is in contact with the gate insulating layer SGI is a gate of the source-side selecting transistor SSTr.

The back gate transistor BTr is composed of the junction point JP, the ONO layer NL (electrical charge storing layer EC), and the back gate line BG. The back gate line BG that is in contact with the ONO layer NL is a gate of the back gate transistor BTr.

Figure 5:
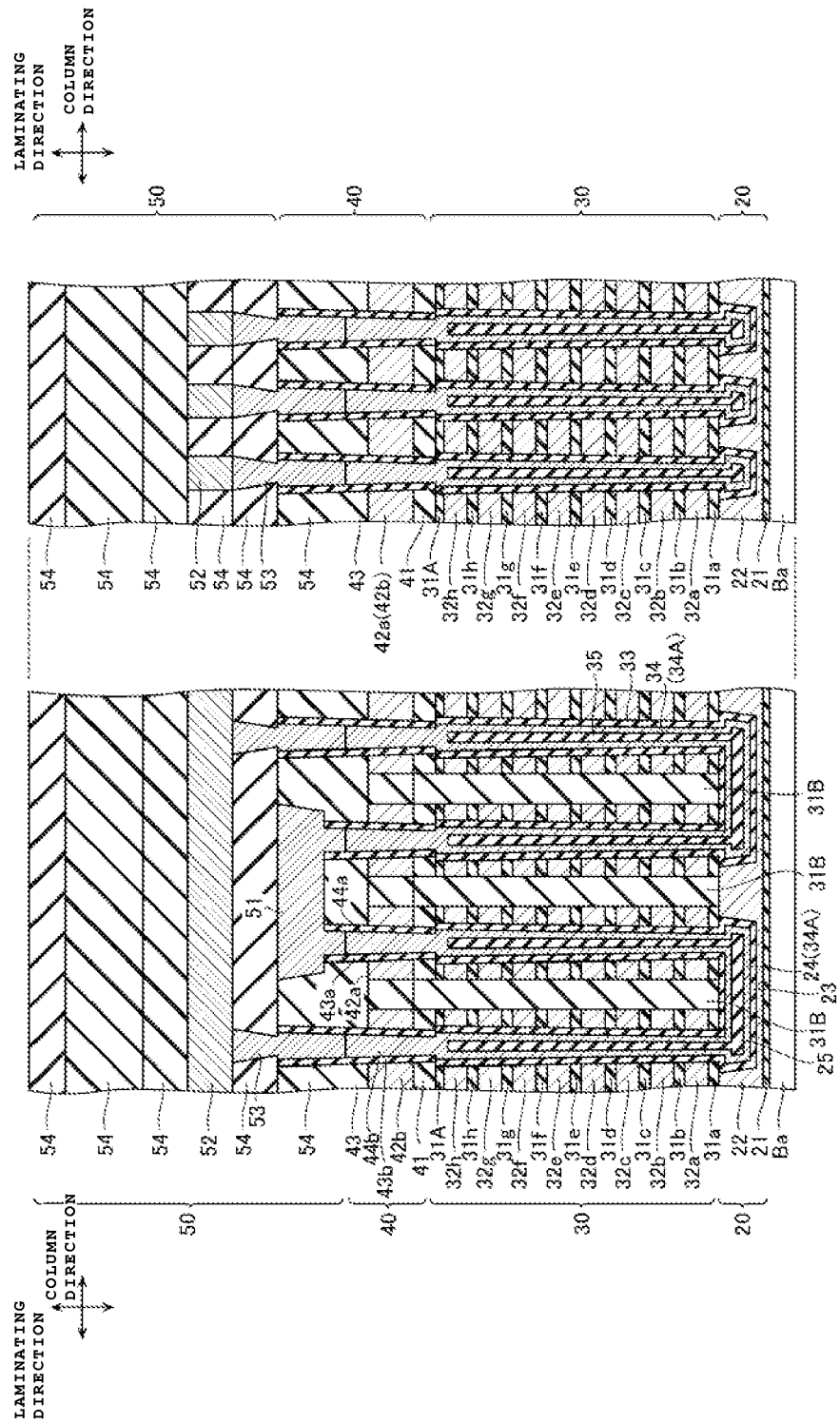
FIGS. 5A and 5B are cross-sectional views of the memory cell region in the non-volatile semiconductor storage device of the first embodiment.

Next, referring to FIGS. 5A and 5B (which may collectively be referred to as FIG. 5), the detailed structure of the memory cell region 12 of the first embodiment will be explained. FIG. 5 is a cross-sectional view of the memory cell region 12 in the non-volatile semiconductor storage device 100 of the first embodiment. FIG. 5A shows the cross-sectional view in the column direction, and FIG. 5B shows the cross-sectional view in the row direction.

First, as shown in FIGS. 5A an 5B, the memory cell region 12 contains a back gate layer 20, a memory layer 30, a selecting transistor layer 40, and a wiring layer 50 all stacked above the semiconductor substrate Ba in that respective order. The back gate layer 20 functions as the back gate transistor BTr. The memory layer 30 contains the memory cells MTr1 to MTr16. The selecting transistor layer 40 includes the drain-side selecting transistor SDTr and the source-side selecting transistor SSTr. The wiring layer 50 contains the source line SL and the bit line BL.

As shown in FIGS. 5A and 5B, the back gate layer 20 contains an insulating layer 21 and a conductive layer 22 stacked above the semiconductor substrate Ba in that respective order. The conductive layer 22 functions as the back gate line BG and the back gate transistor BTr. The insulating layer 21 and the conductive layer 22 are planar layers which extend beneath the entire memory cell region 12.

The insulating layer 21 is composed of silicon dioxide ($SiO_2$). The conductive layer 22 is composed of poly-silicon (poly-Si).

As shown in FIG. 5A and FIG. 5B, the back gate layer 20 contains a memory gate insulating layer 23, a semiconductor layer 24, and an interior insulating layer 25. The semiconductor layer 24 functions as a body (channel) of the back gate transistor BTr.

The memory gate insulating layer 23 comes in contact with the outer perimeter of conductive layer 22. The memory gate insulating layer 23 is placed between one of the lateral surfaces of semiconductor layer 24 and conductive layer 22.

The semiconductor layer 24 is disposed in a recess of conductive layer 22. The semiconductor layer 24 is longer in the column direction than the row direction. In the row-column plane, the semiconductor layer 24 is discontinuous and comprises co-planar component layers, which together form a patterned structure in row and column directions.

On the upper surface of the semiconductor layer 24, the interior insulating layer 25 is disposed.

The memory gate insulating layer 23 includes an electrical-charge storing layer composed of silicon nitride. The semiconductor layer 24 is composed of poly-silicon (poly-Si). The interior insulating layer 25 is composed of silicon dioxide ($SiO_2$).

In relation to the structure of the back gate layer 20, conductive layer 22 surrounds the bottom and lateral surfaces of the memory gate insulating layer 23. The memory gate insulating layer 23 surrounds the bottom and lateral surfaces of the semiconductor layer 24.

The memory layer 30 is formed above the upper layer of the back gate layer 20. The memory layer 30 contains alternately laminated (stacked) insulating layers 31a to 31h and conductive layers 32a to 32h. The conductive layer 32a functions as word lines WL8 and WL9, and gates for the memory transistors MTr8 and MTr9. Similarly, the conductive layers 32b to 32h each function, respectively, as a word line WL1 to WL7, a word line WL16 to WL10, a gate for memory transistor MTr1 to MTr7, and a gate for memory transistor MTr16 to MTr10.

Insulating layers 31a to 31h and conductive layers 32a to 32h have a fixed pitch in the column direction and extend in lengthwise in the row direction (into and out of the page of FIG. 5). The insulating layers 31a to 31h are composed of silicon dioxide ($SiO_2$). The conductive layers 32a to 32h are composed of poly-silicon (poly-Si).

As shown in FIG. 5, the memory layer 30 contains an insulating layer 31A and a columnar insulating layer 31B. The insulating layer 31A is stacked above the insulating layer 31h. The columnar insulating layer 31B extends lengthwise in the laminating direction through the insulating layers 31a to 31h and the conductive layers 32a to 32h, such that each insulating layer and conductive layer has a portion on either side of the columnar insulating layer 31B. The insulating layer 31A is composed of silicon dioxide ($SiO_2$). The columnar insulating layer 31B is composed of silicon nitride (SiN). The detailed explanation of the functions of the columnar insulating layer 31B will be provided in the subsequent discussion of the manufacturing process.

Memory layer 30 contains a memory gate insulating layer 33, a columnar semiconductor layer 34, and an interior insulating layer 35. The columnar semiconductor layer 34 functions as a body (channel) for the memory cells MTr1 to MTr16.

The memory gate insulating layer 33 is in contact with the lateral surface of each of the conductive layers 32a to 32h. The memory gate insulating layer 33 is continuously formed as one with memory gate insulating layer 23, which itself lies in the back gate layer 20. The memory gate insulating layer 33 includes an electric-charge storing layer of silicon nitride (SiN).

Furthermore, the memory gate insulating layer 33 is disposed between one of the lateral surfaces of the columnar semiconductor layer 34 and the conductive layers 32a to 32h. The columnar semiconductor layer 34 penetrates each of the conductive layers 32a to 32h. The columnar semiconductor layer 34 extends in the laminating direction, perpendicular to the semiconductor substrate Ba. The columnar semiconductor layers 34 are vertical extensions of the semiconductor layer 24. The columnar semiconductor layers 34 are composed of poly-silicon (poly-Si).

One lateral surface of interior insulating layer 35 is in contact with a lateral surface of columnar semiconductor layer 34. The interior insulating layer 35 is a vertical extension of the interior insulating layer 25. The interior insulating layer 35 is composed of silicon dioxide ($SiO_2$).

In the back gate layer 20 and the memory layer 30, the pair of columnar semiconductor layers 34 and the semiconductor layer 24 together form the memory semiconductor layer 34A which functions as the body (channel) for the memory string MS. The memory semiconductor layer 34A has a U-shape when viewed from the row direction.

With regards to the configuration of the memory layer 30, the conductive layers 32a to 32h surround the lateral surface of the columnar semiconductor layer 34 and the memory gate insulating layer 33.

As shown in FIG. 5, the selecting transistor layer 40 contains an insulating layer 41, a source-side conductive layer 42a, a drain-side conductive layer 42b, and an insulating layer 43. The insulating layer 41 is formed above the insulating layer 31A. The source-side conductive layer 42a functions as the source-side selecting gate line SGS and a gate for the source-side selecting transistor SSTr. The drain-side conductive layer 42b functions as the drain-side selecting gate line SGD and a gate for the drain-side selecting transistor SDTr.

When neither the source-side conductive layer 42a nor the drain-side conductive layer 42b is specified, the general term "conductive layer 42" may be used to refer to both or either.

The source-side conductive layer 42a and the drain-side conductive layer 42b are formed above the insulating layer 41. The source-side conductive layer 42a is formed above one of the columnar semiconductor layers 34 that forms the memory semiconductor layer 34A. The drain-side conductive layer 42b is above the same layer as the source-side conductive layer 42a, and is formed above the other columnar semiconductor layer 34 which forms the memory semiconductor layer 34A. The source-side conductive layers 42a and drain-side conductive layers 42b have a designated pitch in the column direction and extend in the row direction. The source-side conductive layer 42a and the drain-side conductive layer 42b are composed of poly-silicon (poly-Si).

The insulating layer 43 covers the source-side conductive layer 42a and the drain-side conductive layer 42b. The insulating layer 43 is composed of silicon dioxide ($SiO_2$).

As shown in FIG. 5, the selecting transistor layer 40 contains a source-side gate insulating layer 43a, a source-side columnar semiconductor layer 44a, a drain-side gate insulating layer 43b, and a drain-side columnar semiconductor layer 44b. The source-side columnar semiconductor layer 44a functions as a body (channel) for the source-side selecting transistor. SSTr. The drain-side columnar semiconductor layer 44b functions as a body (channel) for the drain-side selecting transistor SDTr.

The source-side gate insulating layer 43a is in contact with the lateral surface of the source-side conductive layer 42a. The source-side gate insulating layer 43a is composed of silicon dioxide ($SiO_2$).

The source-side gate insulating layer 43a is located between the source-side columnar semiconductor layer 44a and the source-side conductive layer 42a. The source-side columnar semiconductor layer 44a penetrates through the source-side conductive layer 42a. The source-side columnar semiconductor layer 44a is connected to the upper surface of one of the pair of columnar semiconductor layers 34 and is formed as a column extending perpendicular to the semiconductor substrate Ba. The source-side columnar semiconductor layer 44a is composed of poly-silicon (poly-Si).

The drain-side gate insulating layer 43b is in contact with the lateral surface of the drain-side conductive layer 42b. The drain-side gate insulating layer 43b is composed of silicon dioxide ($SiO_2$).

The drain-side gate insulating layer 43b is between the drain-side columnar semiconductor layer 44b and the drain-side conductive layer 42b. The drain-side columnar semiconductor layer 44b penetrates through the drain-side conductive layer 42b. The drain-side columnar semiconductor layer 44b is connected to the upper surface of one of the pair of the columnar semiconductor layers 34 and is formed as a column extending perpendicular to the semiconductor substrate Ba. The drain-side columnar semiconductor layer 44b is composed of poly-silicon (poly-Si).

The structure of the selecting transistor layer 40 will now be described. Within the selecting layer 40, the source-side conductive layer 42a is disposed on the lateral surface of the source-side columnar semiconductor layer 44a. The source-side gate insulating layer 43a lies between the source-side conductive layer 42a and the source-side columnar semiconductor layer 44a. The drain-side conductive layer 42b is disposed on the lateral surface of the drain-side columnar semiconductor layer 44b, such that the drain-side gate insulating layer 43b lies between the drain-side conductive layer 42b and the drain-side columnar semiconductor layer 44b.

A wiring layer 50 contains a source line layer 51, a bit line layer 52, a plug layer 53, and an insulating layer 54. The source line layer 51 functions as source line SL. The bit line layer 52 functions as bit line BL.

The source line layer 51 is in contact with the upper surface of the source-side columnar semiconductor layer 44a and extends lengthwise in the row direction. The bit line layer 52 is in electrical contact with the upper surface of the drain-side columnar semiconductor layer 44b through the plug layer 53 and extends lengthwise in the column direction. The source line layer 51, the bit line layer 52, and the plug layer 53 are composed of a metal such as tungsten.

An insulating layer 54 covers the source line layer 51, the bit line layer 52, and the plug layer 53. The insulating layer 54 is composed of silicon dioxide ($SiO_2$).

Figure 6:
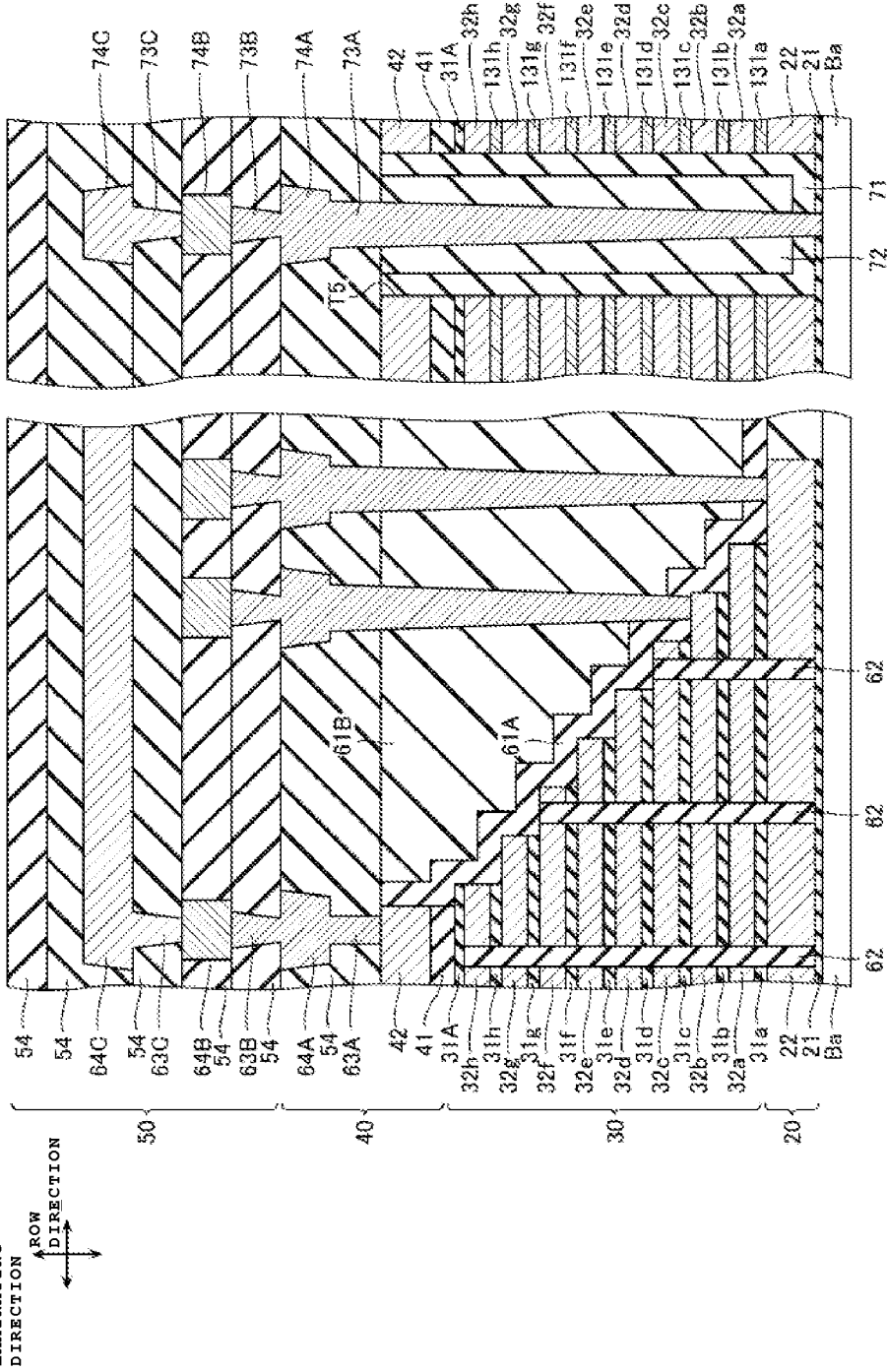
FIGS. 6A and 6B are cross-sectional views of a step contact unit and a surrounding circuit region in the non-volatile semiconductor storage device of the first embodiment.

FIGS. 6A and 6B (which may collectively be referred to as FIG. 6) provides a detailed depiction of the step contact unit 13 and the surrounding circuit region 14. FIG. 6A is a cross-sectional view of step contact unit 13; FIG. 6B is a cross-sectional view of the surrounding circuit region 14.

Step contact unit 13 is disposed at the terminal end of the memory cell region 12. As shown in FIG. 6A, in step contact unit 13, insulating layers 31a to 31h, 31A, conductive layers 32a to 32h, and conductive layer 42 are stacked such that each layer is shorter than the layer immediately below it. In this way, the stacked layers form a structure which resembles a staircase.

As shown in FIG. 6A, the step contact unit 13 contains a supplementary insulating layer 61A, an insulating layer 61B, and a columnar insulating layer 62.

Here, the supplementary insulating layer 61A covers the insulating layers 31a to 31h, 31A, conductive layers 32a to 32h, and the edge of conductive layer 42 which extends in the row direction. Supplementary insulating layer 61A is composed of silicon nitride (SiN).

The insulating layer 61B covers the supplementary insulating layer 61A. Its uppermost surface is level with the upper surface of the conductive layer 42. The insulating layer 61B is composed of silicon dioxide ($SiO_2$).

The columnar insulating layer 62 extends perpendicular to the semiconductor substrate Ba and penetrates through conductive layers 32a to 32h and conductive layer 22. The columnar insulating layer 62 is arranged in a matrix array in both the row direction and the column direction. The columnar insulating layer 62 is composed of silicon nitride (SiN).

As shown in FIG. 6A, the step contact unit 13 contains contacts 63A to 63C and wires 64A to 64C.

As depicted in FIG. 6A, a contact 63A comes in contact with each of the upper surfaces of the conductive layer 22, the conductive layers 32b, and conductive layer 42 (the source-side conductive layer 42a or the drain-side conductive layer 42b). FIG. 6A does not depict contact 63A making contact with conductive layers 32a, 32c to 32h, but such connections can be made as necessary.

The wires 64A are in contact with the upper surface of contacts 63A. The contacts 63B are in contact with the upper surface of wires 64A. The wires 64B are in contact with the upper surface of the contacts 63B. The contacts 63C are in contact with the upper surface of the wires 64B. The wires 64C are in contact with the upper surface of the contacts 63C. The contacts 63A to 63C and the wires 64A to 64C are composed of a metal such as tungsten.

The surrounding circuit region 14 is separate from the memory cell region 12. In the surrounding circuit region 14, a transistor associated with the surrounding circuitry (not shown) is formed above the semiconductor substrate Ba). As shown in FIG. 6B, the surrounding circuit region 14 contains the insulating layer 21 and the conductive layer 22. The insulating layer 21 is an extension of insulating layer 21 in memory region 12 and is formed continuously with that layer from the memory region 12. The conductive layer 22 within the surrounding circuit region 14 is disposed in the same plane/level as the conductive layer 22 within the memory cell region 12. The conductive layer 22 is composed of poly-silicon (poly-Si).

As shown in FIG. 6B, the surrounding circuit region 14 contains conductive layers 131a to 131h which are stacked alternately with the conductive layers 32a to 32h. Each of the conductive layers 131a to 131h within the surrounding circuit region 14 are on the same level as a corresponding insulating layers 31a to 31h within the memory cell region 12. Each of the conductive layers 32a to 32h within the surrounding circuit region 14 is on the same level as a corresponding conductive layer 32a to 32h within the memory cell region 12. The conductive layers 131a to 131h are composed of amorphous silicon. The conductive layers 32a to 32h are composed of poly-silicon (poly-Si). The etching rate of amorphous silicon is greater than the etching rate of poly-silicon in some etchants.

As shown in FIG. 6B, the surrounding circuit region 14 contains the insulating layers 31A and 41. The insulating layers 31A and 41 within the surrounding circuit region 14 are positioned on the same respective layer/level as the insulating layers 31A and 41 within the memory cell region 12. The insulating layers 31A and 41 are composed of silicon dioxide ($SiO_2$).

As shown in FIG. 6B, the surrounding circuit region 14 contains conductive layer 42. The conductive layer 42 within the surrounding circuit region 14 is positioned on the same layer/level as the conductive layer 42 within the memory cell region 12. The conductive layer 42 is composed of poly-silicon (poly-Si).

As shown in FIG. 6B, in the surrounding circuit region 14, the conductive layers 22, 32a to 32h, 131a to 131h, 42, and the insulating layers 31A, 41 are divided by trench T5. Therefore, the edges in the row direction of the conductive layers 22, 32a to 32h, 131a to 131h, 42, and the insulating layers 31A, 41 face the inner wall of trench T5. The trench T5 is formed above a transistor placed on the semiconductor substrate Ba.

As shown in FIG. 6B, the surrounding circuit region 14 contains a supplementary insulating layer 71 and an insulating layer 72 which are within trench T5. The supplementary insulating layer 71 covers the inner wall of the trench T5. The supplementary insulating layer is composed of silicon nitride (SiN). The insulating layer 72 covers the supplementary insulating layer 71 and fills trench T5. The insulating layer 72 is composed of silicon dioxide ($SiO_2$).

As shown in FIG. 6B, the surrounding circuit region 14 contains contacts 73A to 73C and wires 74A to 74C.

The contact 73A contacts the upper surface of the semiconductor substrate Ba and extends in the laminating direction. The contact 73A penetrates through the insulating layer 72 and the supplementary insulating layer 71. A diffusion layer (source/drain) of the previously-described transistor is formed above the semiconductor substrate Ba that is in contact with the contact 73A. The transistor and diffusion layer are not depicted in FIG. 6.

The wire 74A contacts the upper surface of the contact 73A and generally extends in the column direction. The contact 73B contacts the upper surface of the wire 74A and extends in the laminating direction (the laminating direction may also sometimes be referred to as the stacking direction). The wire 74B is in contact with the upper surface of the contact 73B and generally extends in the column direction. The contact 73C contacts the upper surface of the wire 74B and extends in the laminating direction. The wire 74C is in contact with the upper surface of the contact 73C and generally extends in the column direction. The contacts 73A to 73C, and the wires 74A to 74C are composed of a metal such as tungsten.

Figure 7:
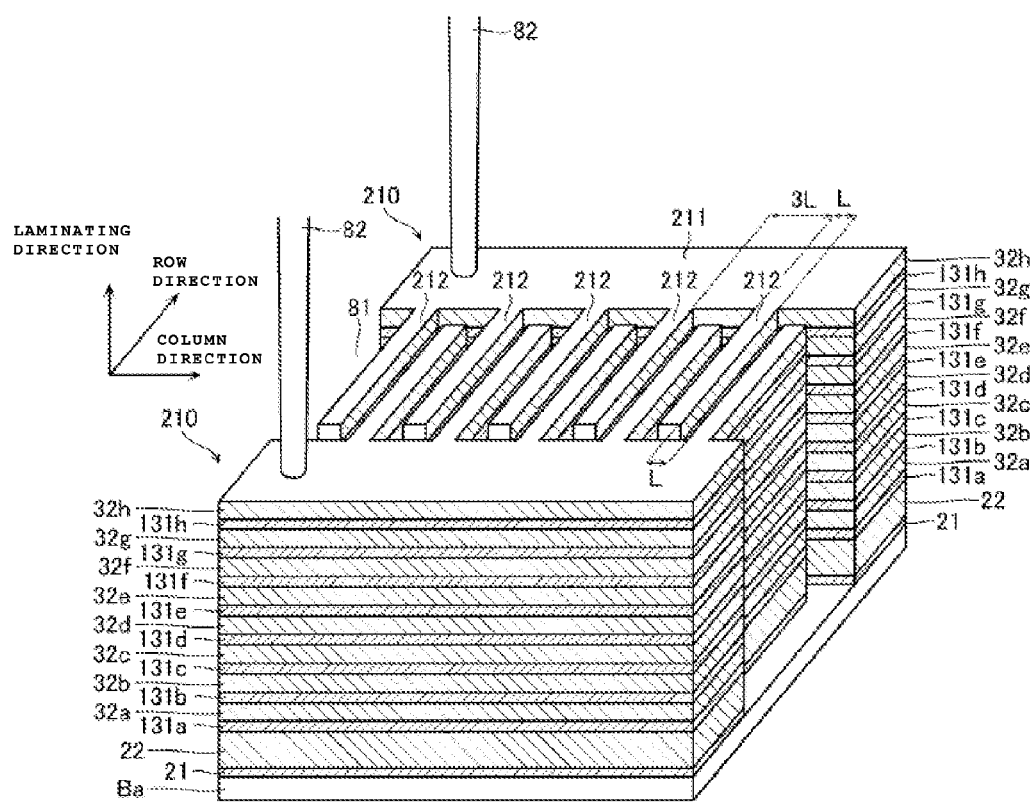
FIG. 7 is a perspective view of a capacitor region in the non-volatile semiconductor storage device of the first embodiment.

Next, FIG. 7 depicts the configuration of a capacitor region 15. FIG. 7 is the perspective view of capacitor region 15. The capacitor region 15 is located in a portion of the surrounding circuit region 14. The capacitor region 15 is a capacitive component. This capacitive component may be used in a booster circuit, for example.

As shown in FIG. 7, capacitor region 15 contains layers stacked similar to the surrounding circuit region 14. That is, the capacitor region 15 contains insulating layer 21, conductive layer 22, and conductive layers 131a to 131h, 32a to 32h.

In the capacitor region 15, there is a first and second unit 210. Moreover, each of the conductive layers 131a to 131h and 32a to 32h are formed in two sections. At every conductive layer 131a-h, 32a-h, one of the two sections is formed as part of the first unit 210 and the other section is formed as part of the second unit 210. The first and second units 210 are as a comb-like structure respectively with an array of protruding elements (fingers/teeth) extending from a base structure. Here the first and second units 210 are arranged so that their protruding elements interlock (interleave) with one another to form an interdigitated structure as depicted in FIG. 7. A device isolation insulating film 81 is formed between the first and second units 210. That is, the device isolation insulating film 81 lies between divided parts of the insulating layer 21, the conductive layer 22 and the conductive layers 131a to 131h, 32a to 32h. The device isolation insulating film 81 is composed of silicon dioxide ($SiO_2$) or silicon nitride (SiN).

Each conductive layer 131a to 131h within the capacitor region 15 is positioned on the same level as the corresponding insulating layer 31a to 31h within the memory cell region 12 (131a is coplanar with 31a, 131b is coplanar with 31b, etc.). The conductive layers 131a to 131h are alternately stacked with the conductive layers 32a to 32h. Additionally, each of the conductive layers 32a to 32h within the capacitor region 15 is positioned on the same level as the corresponding conductive layer 32a to 32h within the memory cell region 12.

When this configuration is used, the first and second units 210 (conductive layers 131a to 131h, 32a to 32h) each function as an electrode of the capacitive component. The device isolation insulating film 81 functions as a dielectric film between these two electrodes of the capacitive component.

Further, as shown in FIG. 7, the capacitor region 15 contains a contact 82. The contact 82 contacts the upper surface of the conductive layer 32h and extends in the stacking direction. The contact 82 is composed of a metal such as tungsten.

The first and second units 210 contain a first line unit 211 which extends in the column direction and a plurality of second line units 212 which protrude in the row direction from the first line unit 211 respectively. Each of the second line units 212 have a width L in the column direction and are spaced apart from neighboring second line units 212 so that a gap of width 3L separates neighboring second line units 212 in the column direction. In the capacitor region 15, the conductive layers 131a to 131h, 32a to 32h, which are electrodes of the capacitor, are stacked in the stacking (laminating) direction. This configuration of the first embodiment minimizes the circuit area occupied by the capacitive component. Additionally, the first embodiment may increase the opposing area of capacitor electrodes of the capacitor components by increasing the number of laminated conductive layers 131a to 131h, 32a to 32h—that is by adding additional layers to the stack.

For instance, in a comparative example that places insulating layers between the conductive layers 32a to 32h, a pair of electrodes might be formed from adjacent conductive layers 32a to 32h above and below the insulating layers. However, in this comparative example, it would be necessary for the contact 82 to extend to each of the conductive layers 32a to 32h. In contrast, with this embodiment, the contact 82 only needs to contact the upper surface of the conductive layer 32h. Therefore, with this embodiment, the necessary number of the contacts 82 is lower than in the comparative example.

Manufacturing Process

Next, refer to FIG. 8 to FIG. 19 to understand the manufacturing method of the non-volatile semiconductor storage device of the first embodiment.

Figure 8:
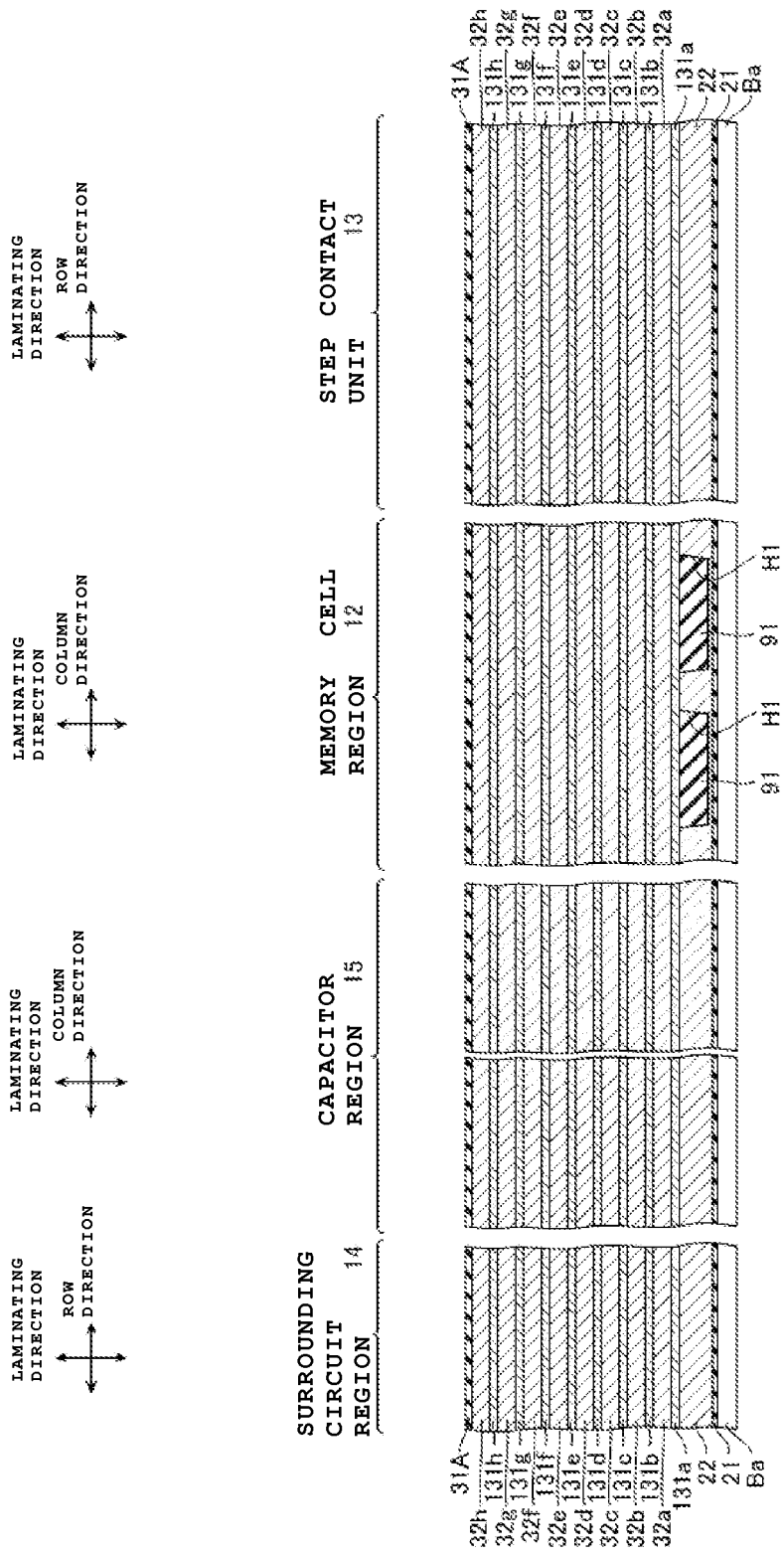
FIGS. 8-19 are cross-sectional views depicting the manufacturing method of the non-volatile semiconductor storage device of the first embodiment.

As shown in FIG. 8, the first step involves silicon dioxide and poly-silicon being stacked on the semiconductor substrate Ba to form the insulating layer 21 and the conductive layer 22. Next, in the memory cell region 12, the conductive layer 22 is etched back to form plural back gate holes H1 in a matrix array. A sacrificial layer 91 is then embedded in the back gate holes H1. The sacrificial layer 91 is composed of, for example, silicon nitride.

As shown in FIG. 8, amorphous silicon and poly-silicon layers are alternately built up to form the conductive layers 131a to 131h and 32a to 32h above the conductive layer 22. Silicon dioxide is then formed above the conductive layer 32h to form the insulating layer 31A.

Figure 9:
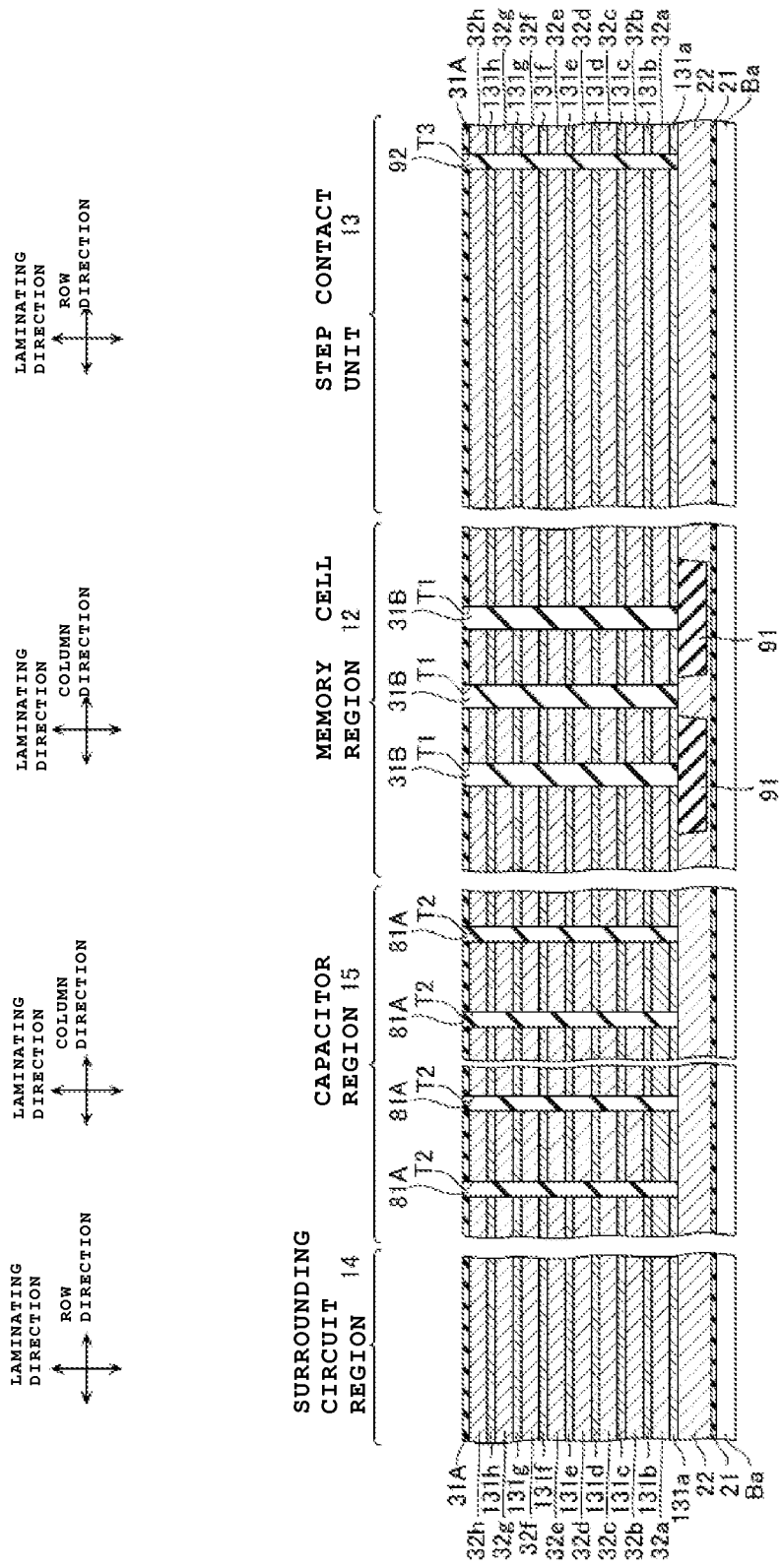

Next, as shown in FIG. 9, in the memory cell region 12 and in the capacitor region 15, trenches T1 and T2 are formed to penetrate the conductive layers 131a to 131h and 32a to 32h and the insulating layer 31A, thereby forming comb-like structures. The trenches T1 are then filled with silicon nitride to form the columnar insulating layer 31B in each trench. Similarly, the trenches T2 are filled with silicon nitride to form the device isolation insulating film 81A in each trench T2.

Additionally, a trench T3 is formed in the step contact unit 13. The trench T3 divides conductive layers 131a to 131h, 32a to 32h and insulating layer 31A at each memory block MB. The trench T3 is then filled with silicon nitride to form a columnar insulating layer 92.

Figure 10:
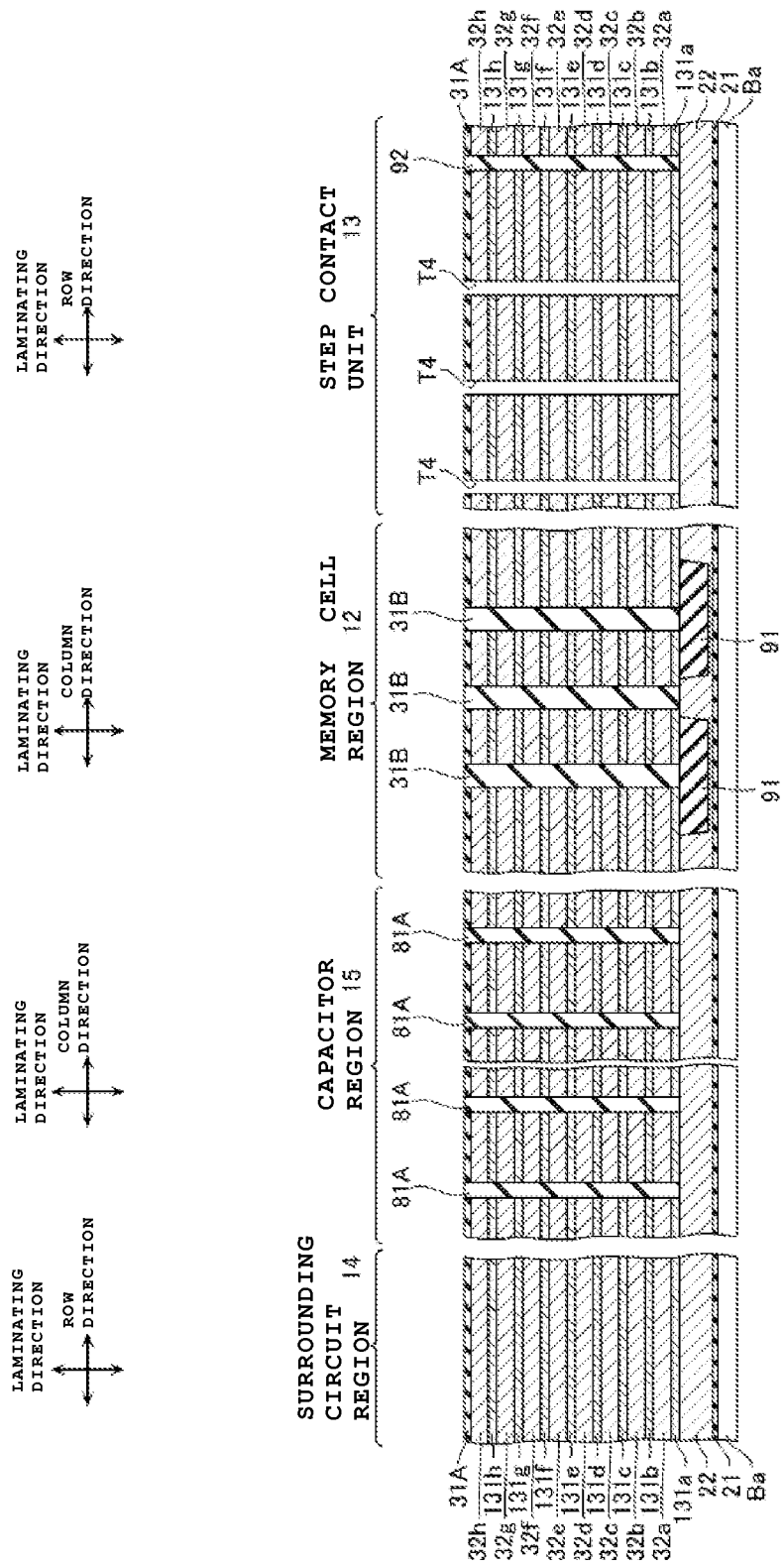

Next, as shown in FIG. 10, a plurality of trenches T4 are formed to penetrate through the conductive layers 131a to 131h, 32a to 32h and the insulating layer 31A.

Figure 11:
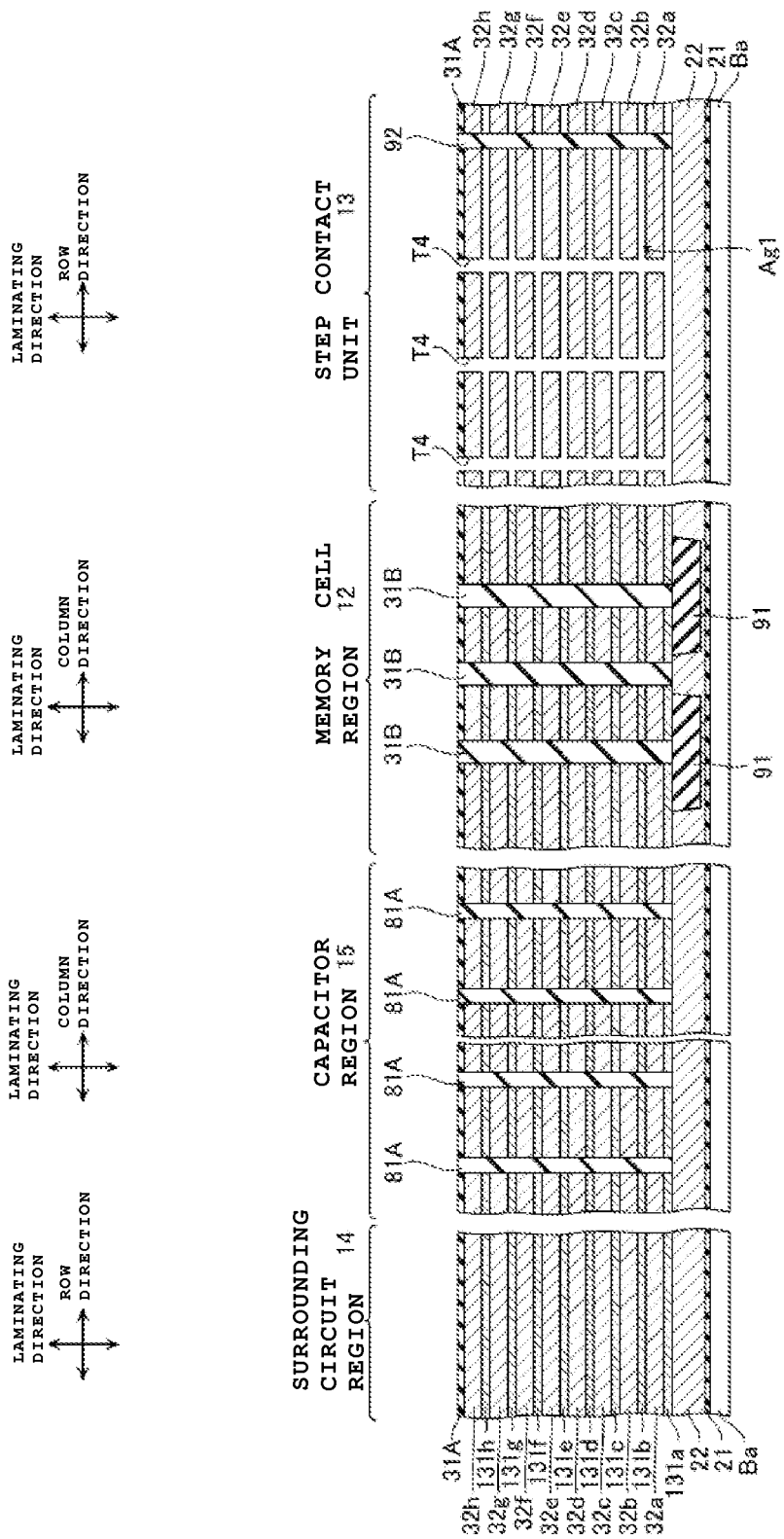

Next, as shown in FIG. 11, wet etching is performed through the trenches T4 in the step contact unit 13 in order to remove conductive layers 131a to 131h. In this wet etching, amorphous silicon, which forms the conductive layers 131a to 131h, has a higher etching rate than poly-silicon, which forms the conductive layers 32a to 32h. As a result of this difference, when the etching is performed between the trenches T4 in the step contact unit 13, the conductive layers 131a to 131h are removed while the conductive layers 32a to 32h remain. Therefore, openings Ag1 are formed between neighboring conductive layers 32a to 32h.

Also, during this wet etch process, the amorphous silicon, which forms the conductive layers 131a to 131h, has a higher etching rate than the silicon nitride which forms the columnar insulating layer 92. Consequently, the columnar insulating layer 92 remains after the wet etching process. The columnar insulating layer 92 functions as a column which supports the conductive layers 32a to 32h.

Figure 12:
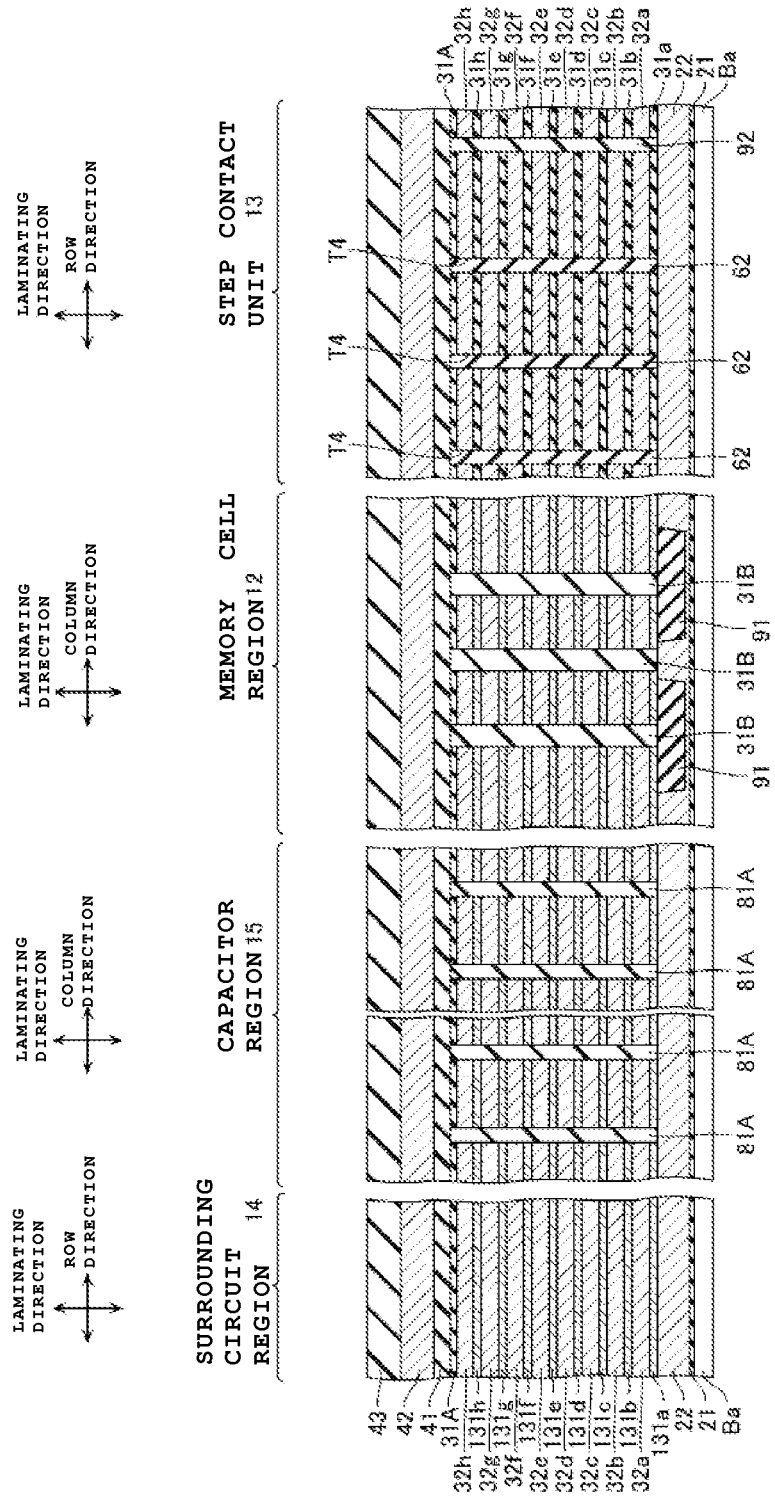

Next, as shown in FIG. 12, silicon dioxide ($SiO_2$) is formed in each opening Ag1 to create the insulating layers 31a to 31h in the step contact unit 13. Here, the silicon dioxide ($SiO_2$) is formed by a method such as CVD. Additionally, silicon nitride is deposited in the trench T4 to form a columnar insulating layer 62. Silicon dioxide, poly-silicon, and silicon dioxide are then formed or deposited above the conductive layer 32h to form the insulating layer 41, the conductive layer 42, and the insulating layer 43.

Figure 13:
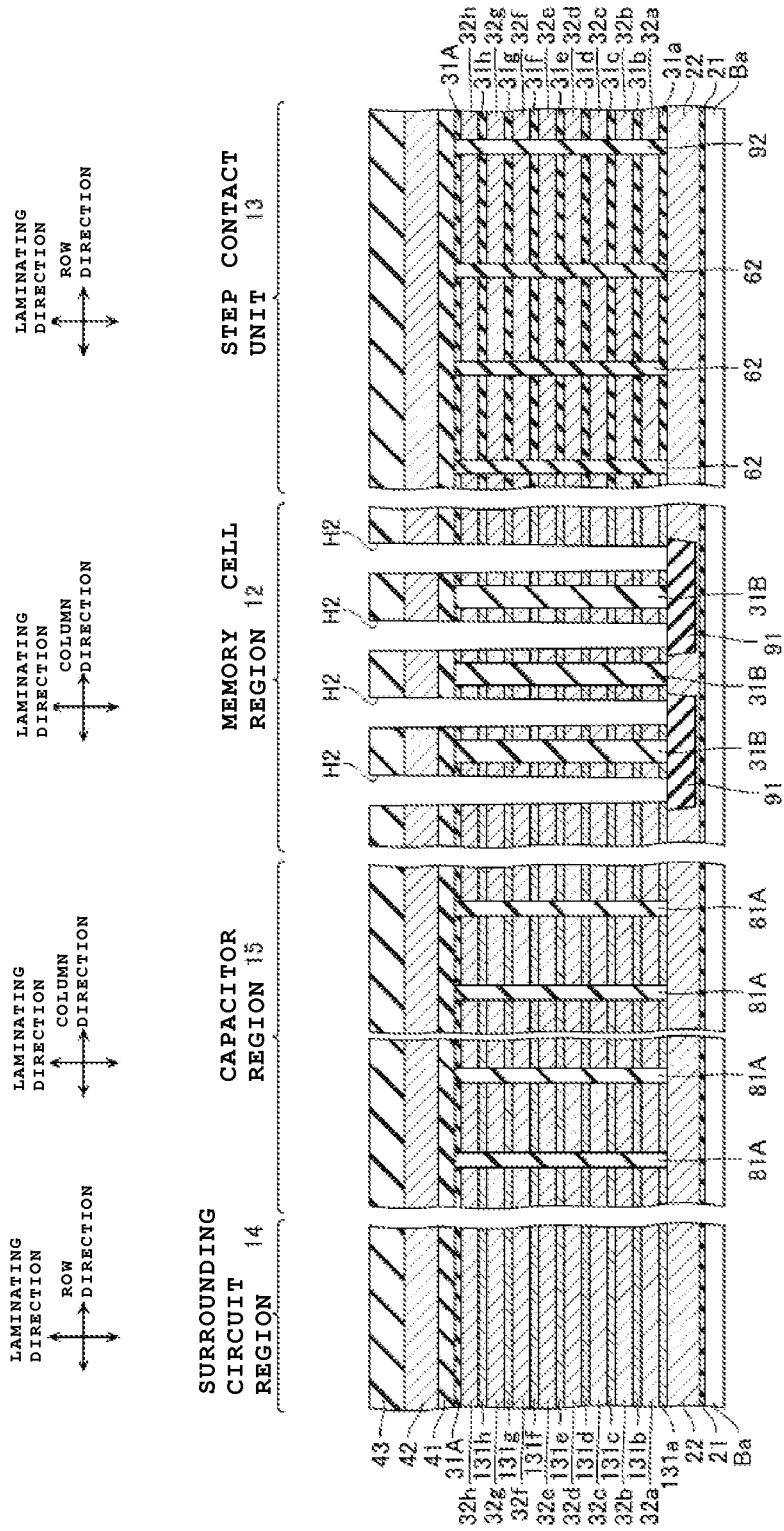

Next, as shown in FIG. 13, in the memory cell region 12, holes H2 are formed so they penetrate through the conductive layers and meet the sacrificial layer 91 at positions near both ends (in the column direction) of the sacrificial layer 91. Hole H2 penetrates through the conductive layers 131a to 131h, 32a to 32h, the insulating layer 31A, 41, the conductive layer 42, and the insulating layer 43.

Figure 14:
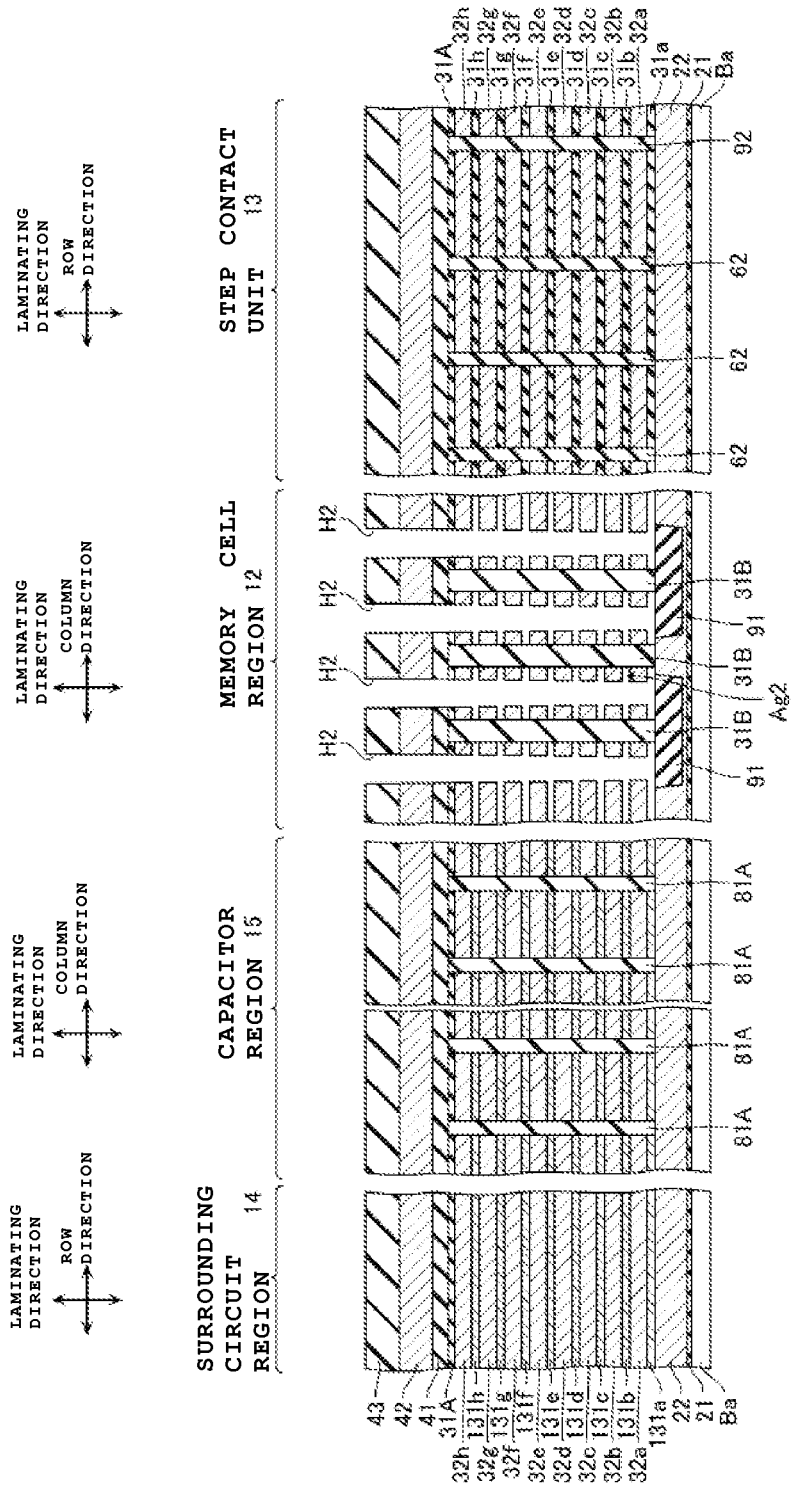

Next, as shown in FIG. 14, wet etching is performed through the hole H2. A key aspect of this wet etching step is that the amorphous silicon in the conductive layers 131a to 131h has a higher etching rate than the poly-silicon in the conductive layers 32a to 32h. Due to this difference in etching rates, the conductive layers 131a to 131h are removed from the memory cell region 12, while the conductive layers 32a to 32h remain. Therefore, openings Ag2 are formed between successively stacked conductive layers 32a to 32h. In addition, in the wet etching, the amorphous silicon of the conductive layers 131a to 131h has a higher etching rate than the silicon nitride of columnar insulating layer 31B. Due to this rate difference, the columnar insulating layer 31B remains after wet etching. The columnar insulating layer 31B functions as a column that supports the conductive layers 32a to 32h.

Figure 15:
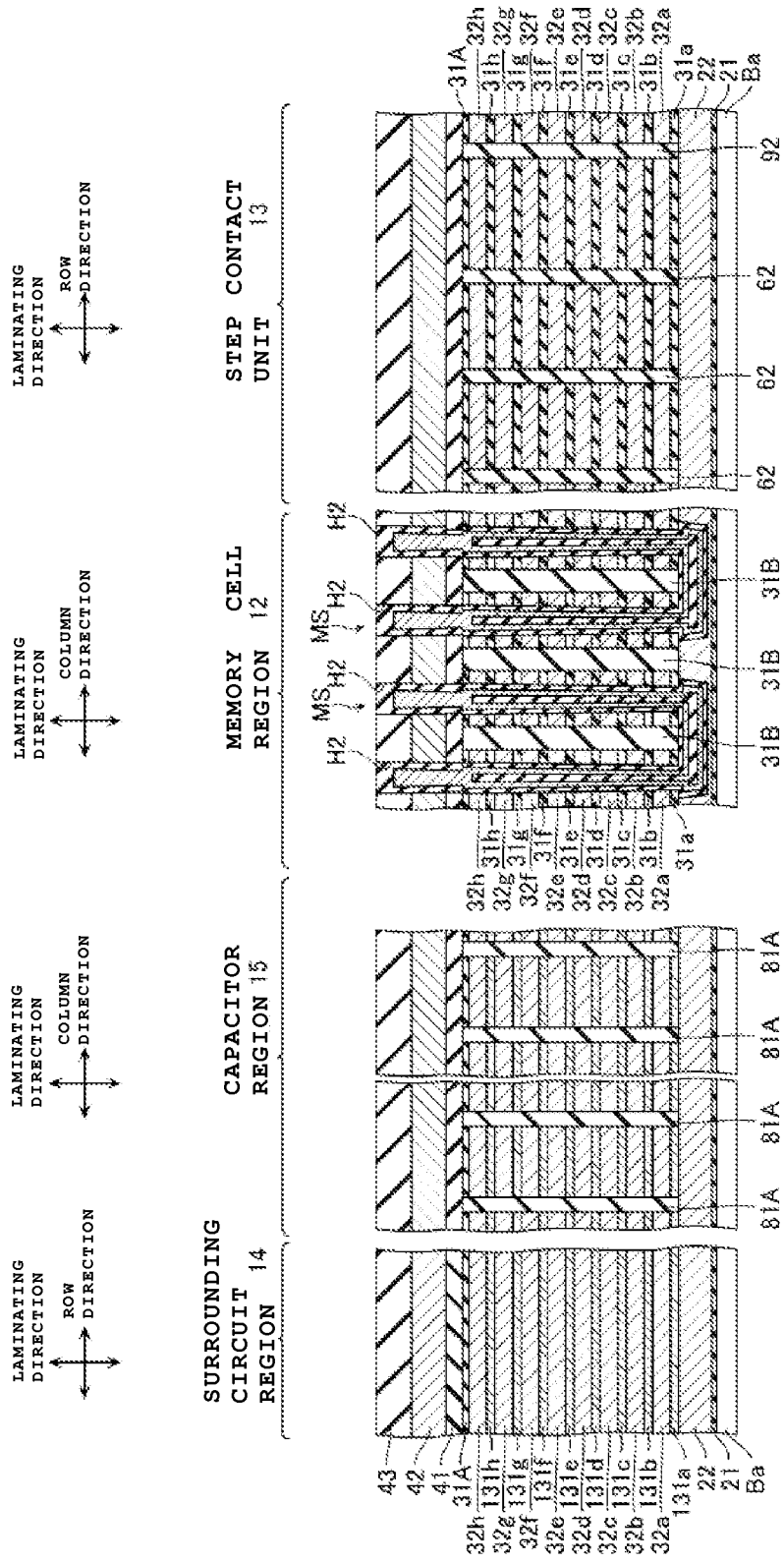

Next, as shown in FIG. 15, silicon dioxide ($SiO_2$) is formed within the opening Ag2. This step results in formation of the insulating layers 31a to 31h in the memory cell region 12. Silicon dioxide is built up by a method such as chemical vapor deposition (CVD). In addition, wet etching is performed through the hole H2 to remove the sacrificing layer 91.

Silicon dioxide, silicon nitride, silicon dioxide, and poly-silicon are then disposed, in that order, on the lateral surfaces of the holes H1 and H2. From this, the memory string MS (memory gate insulating layers 23 and 33, memory semiconductor layer 34A, interior insulating layers 25, 35, source-side gate insulating layer 43a, source-side columnar semiconductor layer 44a, drain-side gate insulating layer 43b, and drain-side columnar semiconductor layer 44b) is formed within the hole H2.

Figure 16:
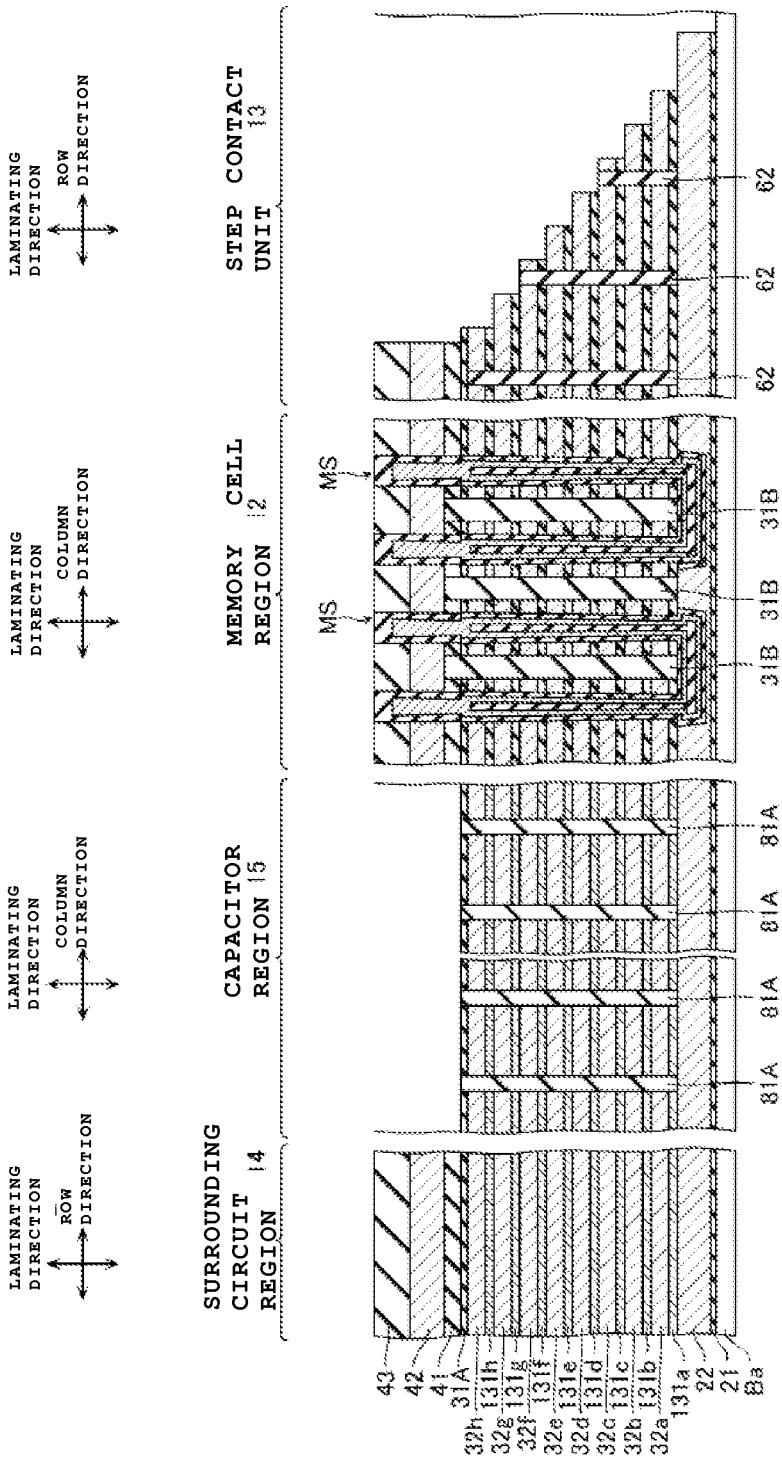

Next, as shown in FIG. 16, in the step contact unit 13, edges in the row direction of the conductive layers 32a to 32h are processed step-wise. As a result, the columnar insulating layer 92 is removed. Additionally, the insulating layer 41, the conductive layer 42, and the insulating layer 43 in the capacitor region 15 are removed as well.

Figure 17:
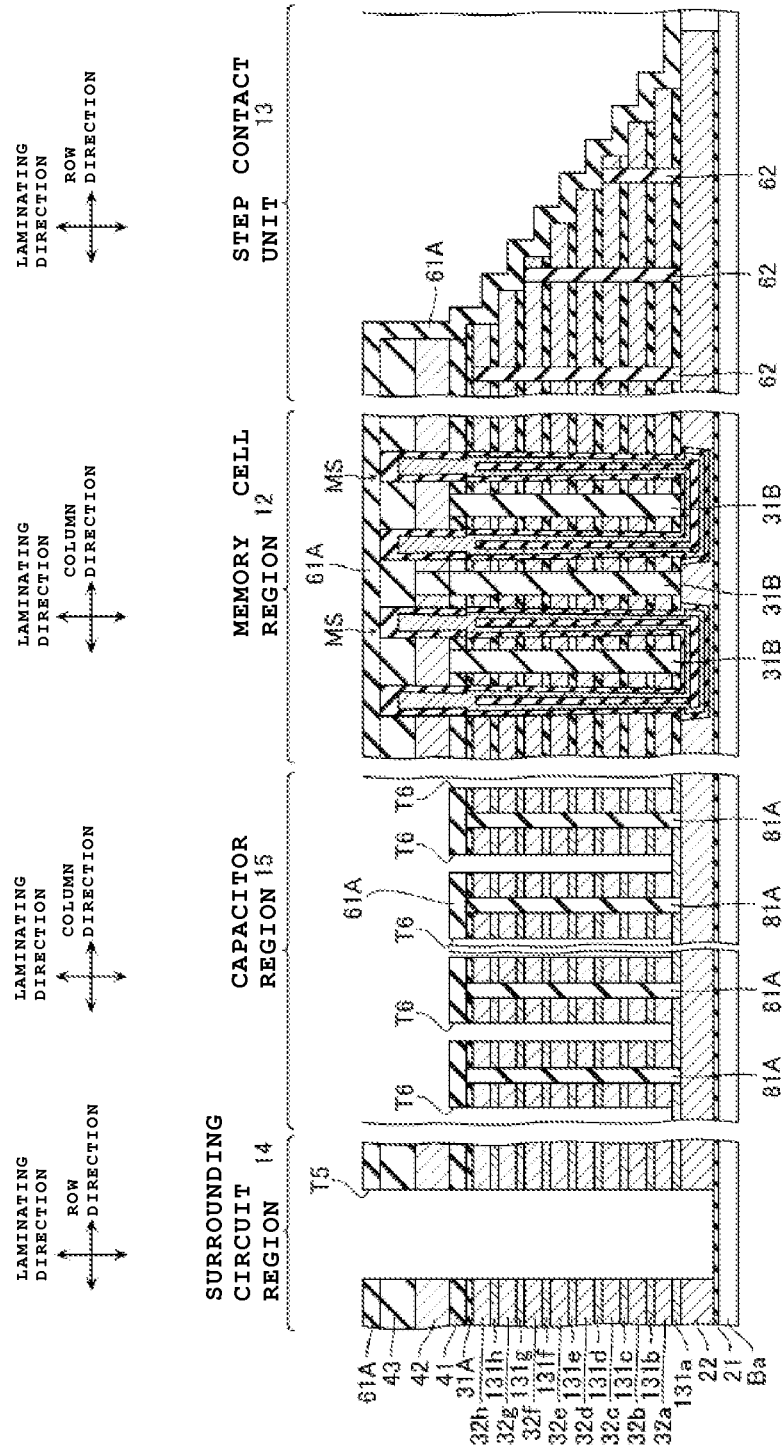

Next, as shown in FIG. 17, silicon nitride is deposited so as to cover the memory cell region 12, the step contact unit 13, the surrounding circuit region 14, and the capacitor region 15. The deposited silicon nitride forms the supplementary insulating layer 61A. The trench T5 which penetrates through the conductive layers 22, 131a to 131h, 32a to 32h, the insulating layer 31A, 41, the conductive layer 42, and the insulating layer 43 is then formed in the surrounding circuit region 14. Additionally, a trench T6 which, when formed, results in ctenidium bodies being created, divides the conductive layers 131b to 131h, 32a to 32h and the insulating layer 31A, 31B in the capacitor region 15.

Figure 18:
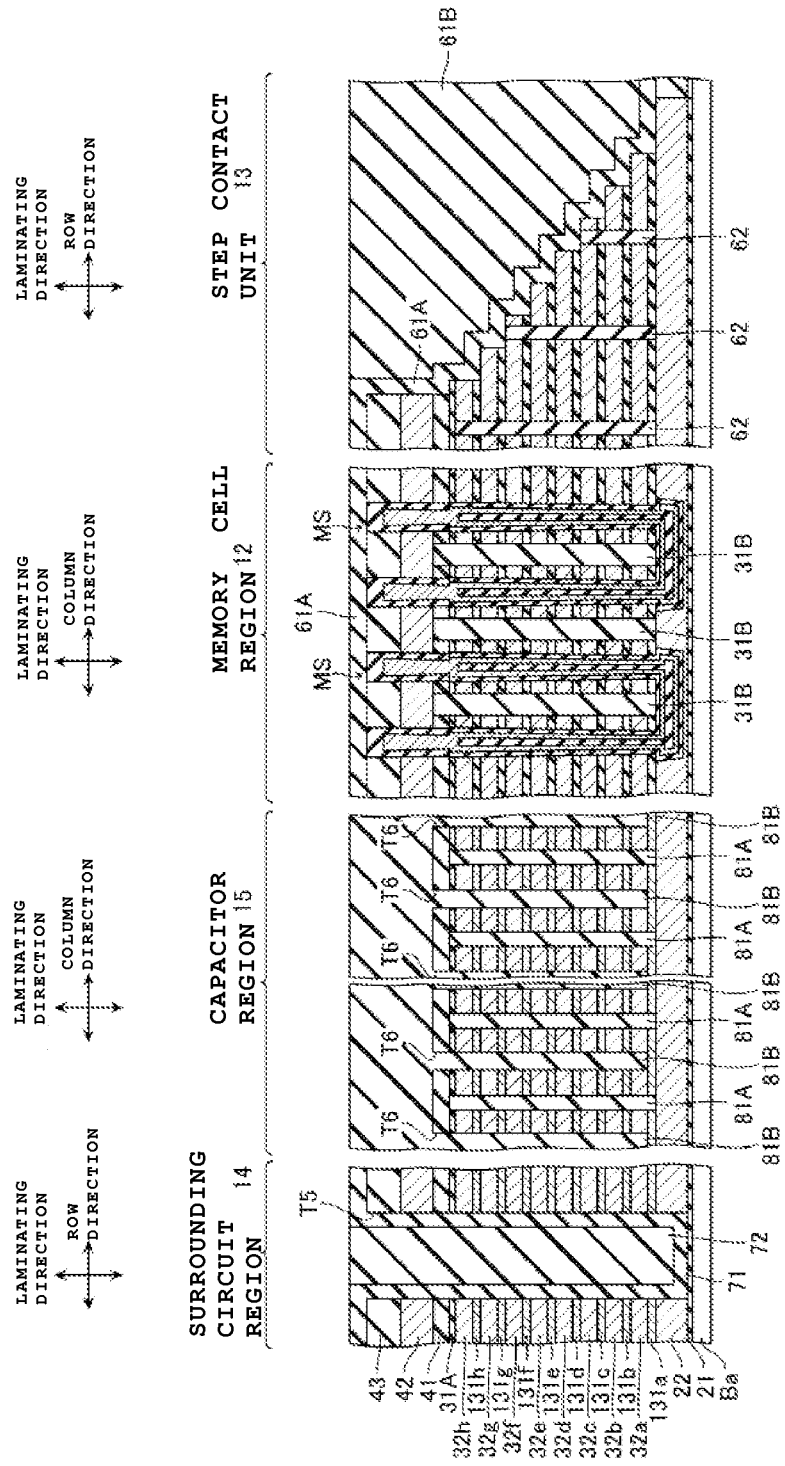

Next, as shown in FIG. 18, silicon nitride is deposited in the trench T5 to form a supplementary insulating layer 71 in the surrounding circuit region 14. Silicon dioxide is then deposited in the step contact unit 13, the surrounding circuit region 14, and the capacitor region 15. This silicon dioxide forms the insulating layer 61B covering the supplementary insulating layer 61A in the step contact unit 13. The insulating layer 72 that fills up trench T5 is also formed in the surrounding circuit region 14 during this deposition process. A device isolation insulating film 81B that fills up the trench T6 is also formed in the capacitor region 15 during this process.

In the capacitor region 15 at the point mentioned in reference to FIG. 17 (that is, before the device isolation insulating film 81B is formed) the lateral surface of the conductive layers 131a to 131h and 32a to 32h may be silicidated (surface treated) through the trench T6 to reduce the resistance.

Silicidation is performed with heat treatment and thus the conductive layers 131a to 131h and 32a to 32h expand. In this embodiment, silicidation on the lateral surface of the conductive layers 131a to 131h and 32a to 32h in trench T2 is not applied as in the other manufacturing process; instead, silicidation is only applied on the lateral surface of the conductive layers 131a to 131h exposed in trench T6. By this process, this embodiment controls the expansion of the conductive layers 131a to 131h and 32a to 32h.

Figure 19:
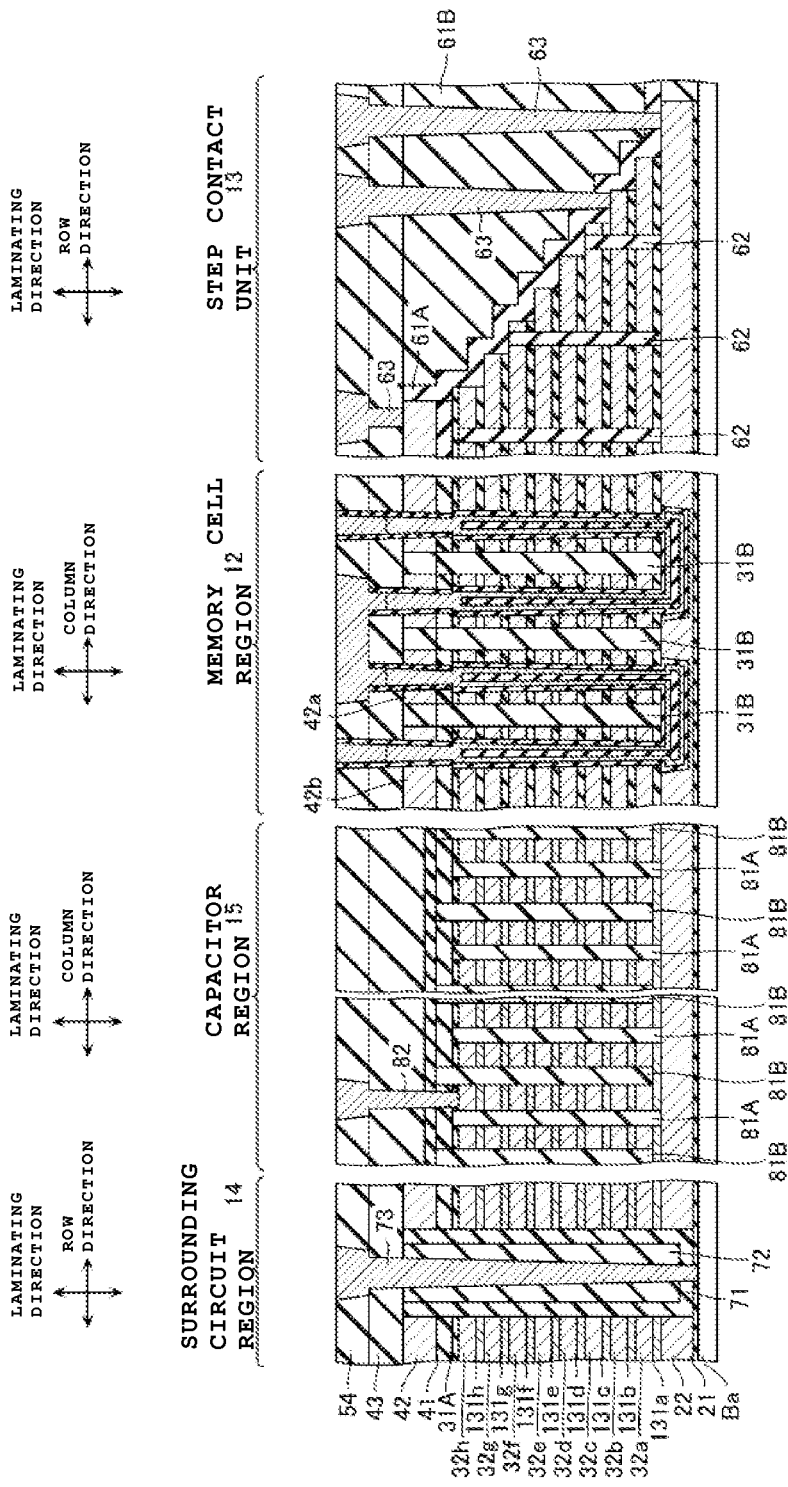

Next, as shown in FIG. 19, in the memory cell region 12, the conductive layer 42 is divided, forming source-side conductive layer 42a and drain-side conductive layer 42b. After that, silicon dioxide is built up to form the insulating layer 54. Contacts 63, 73, 82 are then formed in contact with the upper surface of the conductive layers in the step contact unit 13, the surrounding circuit unit 14, and the capacitor region 15, respectively.

The non-volatile semiconductor storage device of the first embodiment is manufactured using the process as shown in FIGS. 8 to 19. In the capacitor region 15, the layer that functions as the capacitive component is stacked in the same process as the layers within the memory cell region 12. Thus, the first embodiment reduces the number of manufacturing steps.

Second Embodiment

Figure 20:
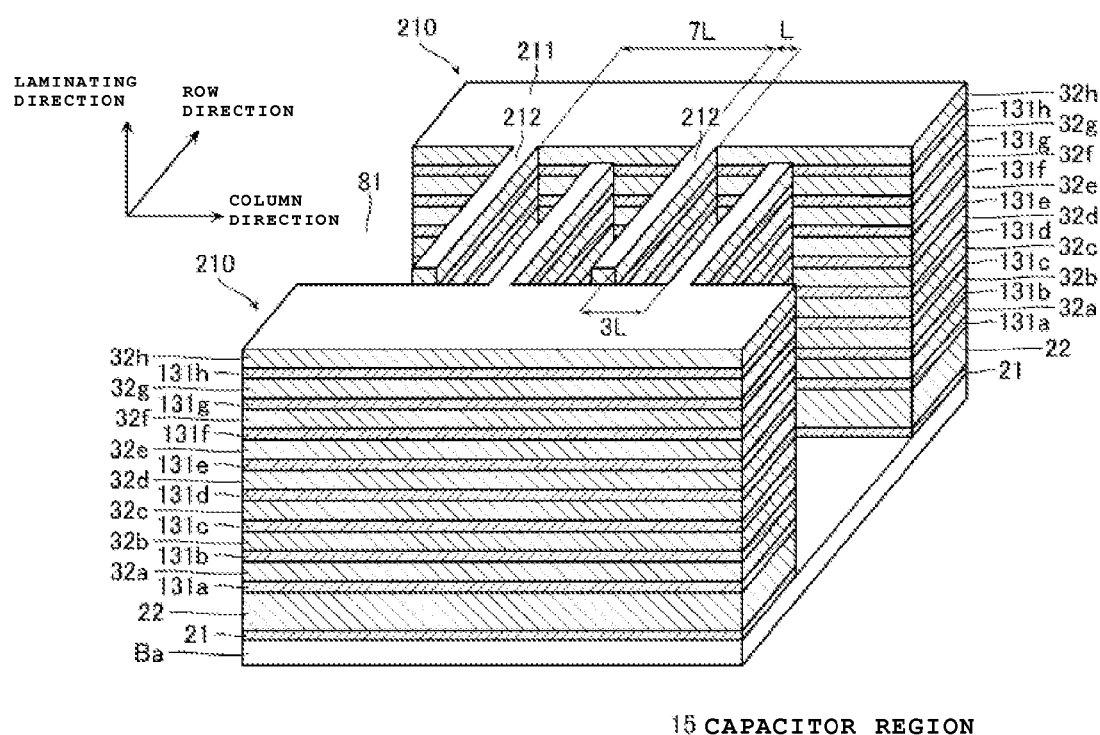
FIG. 20 is a perspective view of a capacitor region in a non-volatile semiconductor storage device according to a second embodiment.

As shown in FIG. 20, in the first and second unit 210 of the second embodiment, the protruding components of the second line unit 212 have a width L in the column direction. However, at each unit 210, the protruding components are spaced apart so that a gap of width 7L lies between neighboring protruding components. That is, for the pair of first and second units 210, the second line unit 211 incorporates gaps of width 3L between immediately neighboring protruding components. Consequently, in the second embodiment, the two units 210 are separated by a greater distance than in the first embodiment (gap of width 3L rather than width 1L). This greater separation has the effect of increasing "pressure resistance" relative to the first embodiment, which means that the device isolation insulation film 81 is less likely to break at higher voltage differences between the two units 210 than in the first embodiment.

Third Embodiment

Figure 21:
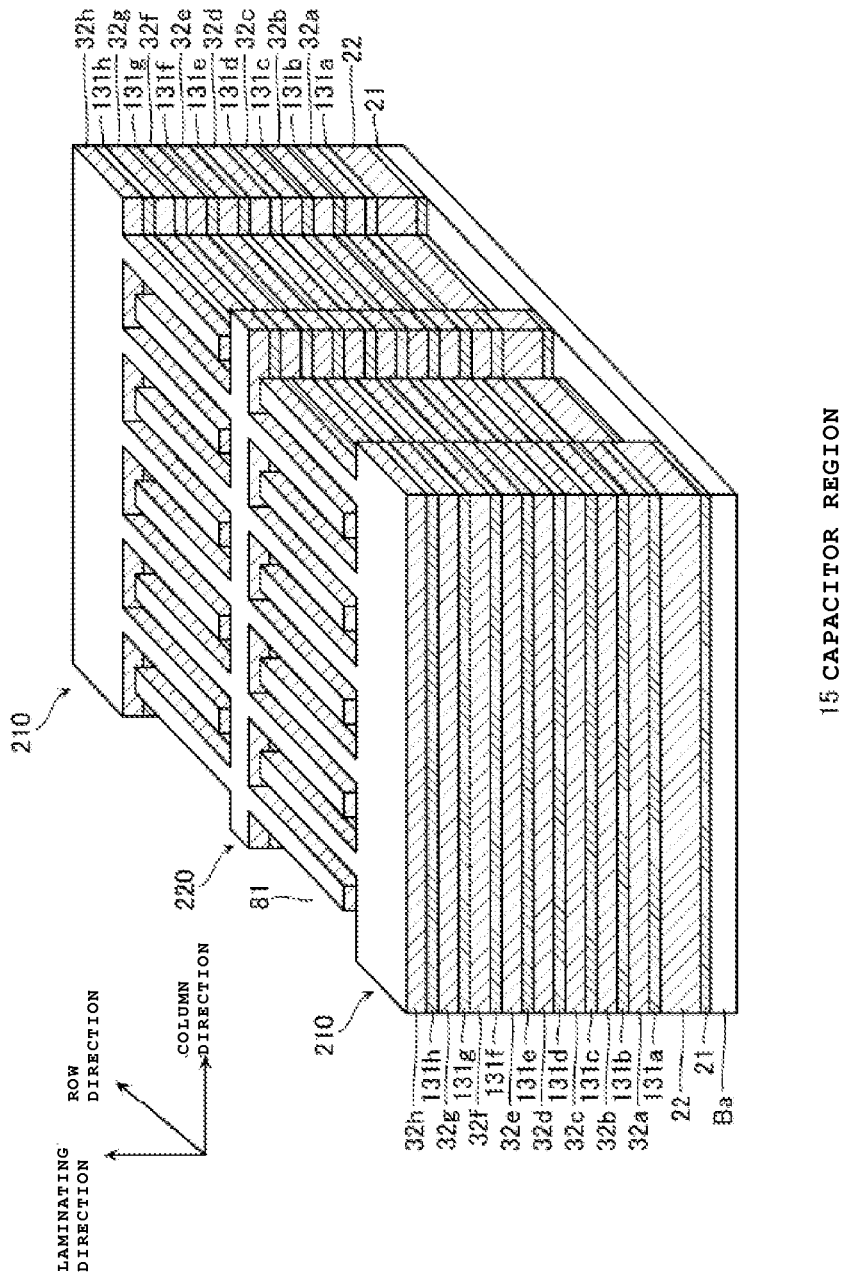
FIG. 21 is a perspective view of a capacitor region in a non-volatile semiconductor storage device according to a third embodiment.

In the third embodiment, depicted in FIG. 21, a unit 220 may be placed between the pair of units 210 within the capacitor region 15. The unit 220 may be applied a voltage between a voltage applied to the first unit 210 and a voltage applied to the second unit 210 after that unit 220 may be floating. The floating unit 220 may be formed by alternately stacking the conductive layers 131a to 131h with conductive layers 32a to 32h, similar to the formation of the units 210. Due to this floating unit 220, the third embodiment will have a higher "pressure resistance" than that of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor storage device comprising:
   a memory cell region formed above a substrate, the memory cell region including a plurality of memory cells in a matrix, the plurality of memory cells formed in a plurality of layers of conductive material stacked above the substrate such that at least one memory cell in the matrix is between at least one other memory cell in the matrix and the substrate;
   a capacitive component formed above the substrate and in the plurality of layers of conductive material stacked above the substrate;
   a first electrode of the capacitive component, the first electrode formed in the plurality of layers of conductive material stacked above the substrate;
   a second electrode of the capacitive component, the second electrode separated from the first electrode by an insulating material and formed in the plurality of layers of conductive material stacked above the substrate;
   wherein the plurality of layers of conductive material comprises alternating stacked layers of a first conductive material and a second conductive material, the first conductive material and the second conductive material having different etch rates.

2. The storage device of claim 1, wherein the first conductive material is polysilicon.

3. The storage device of claim 1, wherein the second conductive material is amorphous silicon.

4. The storage device of claim 3, wherein the first conductive material is polysilicon.

5. The storage device of claim 1, wherein the first electrode and the second electrode are formed as comb-like structures, the comb-like structure comprising a series of protrusions, each protrusion separated by an interval.

6. The storage device of claim 5, further comprising:
   a floating unit, the floating unit formed from the plurality of layers of conductive material stacked above the substrate,
   wherein the floating unit is formed between the first electrode and the second electrode such that the floating unit fills a portion of the interval between each protrusion of the comb-like structures.

7. The storage device of claim 5, wherein the comb-like structure of the first electrode is interleaved with the comb-like structure of the second electrode.

8. The storage device of claim 7, wherein the interval between protrusions is three times the width of each protrusion.

9. The storage device of claim 7, wherein the interval between protrusions is seven times the width of each protrusion.

10. A non-volatile semiconductor storage device comprising:
    a memory cell region formed above a substrate, the memory cell region including a plurality of memory cells in a matrix, the plurality of memory cells formed in a plurality of layers of conductive material laminated above the substrate such that at least one memory cell in the matrix is between at least one other memory cell in the matrix and the substrate;
    a capacitive component formed above the substrate, the capacitive component formed in the plurality of layers of conductive material laminated above the substrate;
    a first electrode of a capacitive component, the first electrode formed in the plurality of conductive layers laminated above the substrate; and a second electrode of the capacitive component, the second electrode formed in the plurality of conductive layers laminated above the substrate and separated from the first electrode and the substrate, wherein the memory cell region comprises a plurality of memory strings, the memory strings formed from a plurality of serially connected memory cells, and each of the memory strings comprises:
- a plurality of first conductive layers that are laminated above the substrate,
- a plurality of insulating layers formed above and below the plurality of the first conductive layers,
- a semiconductor layer that is formed penetrating through the plurality of first conductive layers and the plurality of insulating layers, and
- an electrical charge storing layer formed between the first conductive layer and the semiconductor layer; and the first electrode and the second electrode each comprise:
- a plurality of second conductive layers formed on the same layer as the first conductive layer, and
- a plurality of third conductive layers formed above and below the plurality of second conductive layers and formed on the same layer as the insulating layers.

11. The non-volatile semiconductor storage device according to claim 10, wherein the second and third conductive layers are formed with materials having different etching rates.

12. The non-volatile semiconductor storage device according to claim 11, wherein the memory cell region further comprises an insulating layer that extends in the laminating direction as a longer direction penetrating through the first conductive layer and insulating layer, and the third conductive layer and the insulating layer are formed with materials having different etching rates.

13. The non-volatile semiconductor storage device according to claim 10, wherein the second conductive layers comprise of poly-silicon, and the third conductive layers comprise amorphous silicon.

14. The non-volatile semiconductor storage device according to claim 13, wherein the first electrode and the second electrode are formed as comb-like structures, the comb-like structure comprising a series of protrusions, each protrusion separated by an interval.

* * * * *